United States Patent
Wang et al.

(10) Patent No.: US 12,404,169 B2
(45) Date of Patent: *Sep. 2, 2025

(54) LARGE-SCALE PLASMONIC HYBRID FRAMEWORK WITH BUILT-IN NANOHOLE ARRAYS AS MULTIFUNCTIONAL OPTICAL SENSING PLATFORMS

(71) Applicant: Purdue Research Foundation, West Lafayette, IN (US)

(72) Inventors: Haiyan Wang, West Lafayette, IN (US); Xuejing Wang, Los Alamos, NM (US); Xinghang Zhang, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 257 days.

This patent is subject to a terminal disclaimer.

(21) Appl. No.: 17/791,980

(22) PCT Filed: Feb. 4, 2021

(86) PCT No.: PCT/US2021/016657
§ 371 (c)(1),
(2) Date: Jul. 11, 2022

(87) PCT Pub. No.: WO2021/158816
PCT Pub. Date: Aug. 12, 2021

(65) Prior Publication Data
US 2023/0047636 A1    Feb. 16, 2023

Related U.S. Application Data

(60) Provisional application No. 62/970,948, filed on Feb. 6, 2020.

(51) Int. Cl.
*B81C 1/00*    (2006.01)

(52) U.S. Cl.
CPC .... *B81C 1/00087* (2013.01); *B81B 2207/056* (2013.01)

(58) Field of Classification Search
CPC .................. G02B 1/00–1/18; B81C 1/00087
See application file for complete search history.

(56) References Cited

U.S. PATENT DOCUMENTS

| 2005/0062033 A1 | 3/2005 | Ichihara et al. |
| 2008/0224115 A1 | 9/2008 | Bakkers et al. |

(Continued)

FOREIGN PATENT DOCUMENTS

WO    2017211995 A1    12/2017

OTHER PUBLICATIONS

Huang et al. "Nanoscale Artificial Plasmonic Lattice in Self-Assembled Vertically Aligned Nitride-Metal Hybrid Metamaterials", Advanced Science, 5, 1800416, (2018); pp. 1800416-1 to 1800416-9.*

(Continued)

*Primary Examiner* — Prashant J Khatri
(74) *Attorney, Agent, or Firm* — Piroozi-IP, LLC

(57) ABSTRACT

A nanohole template is disclosed which includes a substrate and a vertically aligned nanocomposite (VAN) structure disposed over the substrate. The VAN structure is a metal nitride having circular periodic nanoholes of about 2 nm to about 20 nm in diameter.

6 Claims, 26 Drawing Sheets

(56) References Cited

U.S. PATENT DOCUMENTS

2011/0244235 A1   10/2011  Wildeson et al.
2014/0319339 A1*  10/2014  Hall .................... H01J 37/261
                                                                        435/5

OTHER PUBLICATIONS

Wang et al. "Self-Assembled Ag—TiN Hybrid Plasmonic Metamaterial: Tailorable Tilted Nanopillar and Optical Properties", Advanced Optical Materials, 7, 1801180, (2019); pp. 1801180-1 to 1801180-9.*

Sacher R. "Microscope Immersion Oil". Microscopy Today, (2000), 8(8); pp. 33-35.*

Yim et al., Transferrable Plasmonic Au Thin Film Containing Sub-20 nm Nanohole Array Constructed via High-Resolution Polymer Self-Assembly and Nanotransfer Printing. ACS Appl. Mater. Interfaces 2018, 10 (3), 2216-2223.

Cetin et al., Plasmonic Nanohole Arrays on a Robust Hybrid Substrate for Highly Sensitive Label-Free Biosensing. ACS Photonics 2015, 2 (8), 1167-1174.

Genet et al., Fano-type interpretation of red shifts and red tails in hole array transmission spectra. Optics Communications 2003, 225 (4), 331-336.

Shin et al., Effect of the plasmonic dispersion relation on the transmission properties of subwavelength cylindrical holes. Phys. Rev. B 2005, 72 (8), 085436.

Shekhar et al., Hyperbolic metamaterials: fundamentals and applications. Nano Convergence 2014, 1 (1), 14.

Poddubny et al., Hyperbolic metamaterials. Nat. Photon. 2013, 7 (12), 948-957.

Dou et al., Atomically thin two-dimensional organic-inorganic hybrid perovskites. Science 2015, 349 (6255), 1518-1521.

Zhang et al., Photonics and optoelectronics using nano-structured hybrid perovskite media and their optical cavities. Physics Reports 2019, 795, 1-51.

Gao et al., Highly Stable Lead-Free Perovskite Field-Effect Transistors Incorporating Linear π-Conjugated Organic Ligands. J. Am. Chem. Soc. 2019, 141 (39), 15577-15585.

Eftekhari et al., Nanoholes As Nanochannels: Flow-through Plasmonic Sensing. Analytical Chemistry 2009, 81 (11), 4308-4311.

Krishnan et al., Evanescently coupled resonance in surface plasmon enhanced transmission. Optics Communications 2001, 200 (1), 1-7.

Valsecchi et al., Periodic Metallic Nanostructures as Plasmonic Chemical Sensors. Langmuir 2013, 29 (19), 5638-5649.

Xue et al., Ultrasensitive detection of miRNA with an antimonene-based surface plasmon resonance sensor. Nat. Commun. 2019, 10 (1), 28.

Mosier-Boss, Review of SERS Substrates for Chemical Sensing. Nanomaterials 2017, 7 (6), 142.

Al Balushi et al., Label-free free-solution nanoaperture optical tweezers for single molecule protein studies. Analyst 2015, 140 (14), 4760-4778.

Prasad et al., Nanohole array plasmonic biosensors: Emerging point-of-care applications. Biosensors and Bioelectronics 2019, 130, 185-203.

Lee et al., Self-Assembled Plasmonic Nanohole Arrays. Langmuir 2009, 25 (23), 13685-13693.

Saboktakin et al., Plasmonic Enhancement of Nanophosphor Upconversion Luminescence in Au Nanohole Arrays. ACS Nano 2013, 7 (8), 7186-7192.

Al et al., Plasmonic Nanochemistry Based on Nanohole Array. ACS Nano 2017, 11 (12), 12094-12102.

Ebbesen et al., Extraordinary optical transmission through subwavelength hole arrays. Nature 1998, 391 (6668), 667-669.

Martín-Moreno et al., Theory of Extraordinary Optical Transmission through Subwavelength Hole Arrays. Physical Review Letters 2001, 86 (6), 1114-1117.

Barnes et al., Surface plasmon subwavelength optics. Nature 2003, 424 (6950), 824-830.

De Leebeeck et al., On-Chip Surface-Based Detection with Nanohole Arrays. Analytical Chemistry 2007, 79 (11), 4094-4100.

Henzie et al., Multiscale patterning of plasmonic metamaterials. Nat. Nanotechnol. 2007, 2 (9), 549-554.

Li et al., Plasmonic nanohole array biosensor for label-free and real-time analysis of live cell secretion. Lab on a Chip 2017, 17 (13), 2208-2217.

Im et al., Plasmonic Nanoholes in a Multichannel Microarray Format for Parallel Kinetic Assays and Differential Sensing. Analytical Chemistry 2009, 81 (8), 2854-2859.

Van Beijnum et al., Surface Plasmon Lasing Observed in Metal Hole Arrays. Physical Review Letters 2013, 110 (20), 206802.

Mahigir et al., Plasmonic nanohole array for enhancing the SERS signal of a single layer of graphene in water. Sci. Rep. 2017, 7 (1), 14044.

Zhao et al., Toward highly sensitive surface-enhanced Raman scattering: the design of a 3D hybrid system with monolayer graphene sandwiched between silver nanohole arrays and gold nanoparticles. Nanoscale 2017, 9 (3), 1087-1096.

Im et al., Template-Stripped Smooth Ag Nanohole Arrays with Silica Shells for Surface Plasmon Resonance Biosensing. ACS Nano 2011, 5 (8), 6244-6253.

Lee et al., Linewidth-Optimized Extraordinary Optical Transmission in Water with Template-Stripped Metallic Nanohole Arrays. Adv. Funct. Mater. 2012, 22 (21), 4439-4446.

Zhou et al., Self-assembly of highly efficient, broadband plasmonic absorbers for solar steam generation. Science Advances 2016, 2 (4), e1501227.

Shingubara, Fabrication of Nanomaterials Using Porous Alumina Templates. Journal of Nanoparticle Research 2003, 5 (1), 17-30.

Jiang et al., Wafer-Scale Periodic Nanohole Arrays Templated from Two-Dimensional Nonclose-Packed Colloidal Crystals. J. Am. Chem. Soc. 2005, 127 (11), 3710-3711.

International Search Report for PCT/US2021/016657 published Apr. 23, 2021; 7 pages.

Wang et al., Hybrid plasmonic Au—TiN vertically aligned nanocomposites: a nanoscale platform towards tunable optical sensing. Nanoscale Adv., 2019, 1, 1045-1054.

Wang et al., Supplementary Information: Hybrid plasmonic Au—TiN vertically aligned nanocomposites: a nanoscale platform towards tunable optical sensing. Nanoscale Adv., 2019, 1, 1045-1054.

Masson et al., Nanohole arrays in chemical analysis: manufacturing methods and applications. Analyst 2010, 135 (7), 1483-1489.

Ohno et al., Hole-size tuning and sensing performance of hexagonal plasmonic nanohole arrays. Opt. Mater. Express 2016, 6 (5), 1594-1603.

Escobedo, On-chip nanohole array based sensing: a review. Lab on a Chip 2013, 13 (13), 2445-2463.

Yu et al., Inverted Size-Dependence of Surface-Enhanced Raman Scattering on Gold Nanohole and Nanodisk Arrays. Nano Lett. 2008, 8 (7), 1923-1928.

Gordon et al., Strong Polarization in the Optical Transmission through Elliptical Nanohole Arrays. Physical Review Letters 2004, 92 (3), 037401.

Lindquist et al., Sub-micron resolution surface plasmon resonance imaging enabled by nanohole arrays with surrounding Bragg mirrors for enhanced sensitivity and isolation. Lab on a Chip 2009, 9 (3), 382-387.

Cole et al., Understanding Plasmons in Nanoscale Voids. Nano Lett. 2007, 7 (7), 2094-2100.

Takayama et al., Midinfrared Surface Waves on a High Aspect Ratio Nanotrench Platform. ACS Photonics 2017, 4 (11), 2899-2907.

Shkondin et al., High aspect ratio titanium nitride trench structures as plasmonic biosensor. Opt. Mater. Express 2017, 7 (11), 4171-4182.

Boltasseva et al., Low-Loss Plasmonic Metamaterials. Science 2011, 331 (6015), 290-291.

Guler et al., Nanoparticle plasmonics: going practical with transition metal nitrides. Materials Today 2015, 18 (4), 227-237.

Wang et al., Epitaxial growth of TaN thin films on Si(100) and Si(111) using a TiN buffer layer. Appl. Phys. Lett. 2002, 30 (13), 2323-2325.

(56) References Cited

OTHER PUBLICATIONS

Li et al., Refractory Plasmonics with Titanium Nitride: Broadband Metamaterial Absorber. Advanced Materials 2014, 26 (47), 7959-7965.
Naik et al., Titanium nitride as a plasmonic material for visible and near-infrared wavelengths. Opt. Mater. Express 2012, 2 (4), 478-489.
Guler et al., Local Heating with Lithographically Fabricated Plasmonic Titanium Nitride Nanoparticles. Nano Lett. 2013, 13 (12), 6078-6083.
Ishii et al., Titanium Nitride Nanoparticles as Plasmonic Solar Heat Transducers. J. Phys. Chem. C 2016, 120 (4), 2343-2348.
Wang et al., Self-Assembled Ag—TiN Hybrid Plasmonic Metamaterial: Tailorable Tilted Nanopillar and Optical Properties. Advanced Optical Materials 2019, 7 (3), 1801180.
Huang et al., Nanoscale Artificial Plasmonic Lattice in Self-Assembled Vertically Aligned Nitride-Metal Hybrid Metamaterials. Adv. Sci. 2018, 5 (7), 1800416.
Maoz et al., Chiroptical Effects in Planar Achiral Plasmonic Oriented Nanohole Arrays. Nano Lett. 2012, 12 (5), 2357-2361.
Escobedo et al., Flow-Through vs Flow-Over: Analysis of Transport and Binding in Nanohole Array Plasmonic Biosensors. Analytical Chemistry 2010, 82 (24), 10015-10020.
Barik et al., Dielectrophoresis-Enhanced Plasmonic Sensing with Gold Nanohole Arrays. Nano Lett. 2014, 14 (4), 2006-2012.
Lesuffleur et al., Laser-illuminated nanohole arrays for multiplex plasmonic microarray sensing. Opt. Express 2008, 16 (1), 219-224.
Jia et al., Plasmonic nanohole array sensors fabricated by template transfer with improved optical performance. Nanotechnology 2013, 24 (19), 195501.
Vala et al., Plasmonic Sensing on Symmetric Nanohole Arrays Supporting High-Q Hybrid Modes and Reflection Geometry. ACS Sensors 2019, 4 (12), 3265-3274.
Caballero et al., Hybrid Magnetoplasmonic Crystals Boost the Performance of Nanohole Arrays as Plasmonic Sensors. ACS Photonics 2016, 3 (2), 203-208.
Virk et al., Thermal Plasmonic Sensor Platform: Resistive Heating of Nanohole Arrays. Nano Lett. 2014, 14 (6), 3544-3549.
Jackman et al., Plasmonic Nanohole Sensor for Capturing Single Virus-Like Particles toward Virucidal Drug Evaluation. Small 2016, 12 (9), 1159-1166.
Zheng et al., Tailoring plasmonic properties of gold nanohole arrays for surface-enhanced Raman scattering. Physical Chemistry Chemical Physics 2015, 17 (33), 21211-21219.

\* cited by examiner

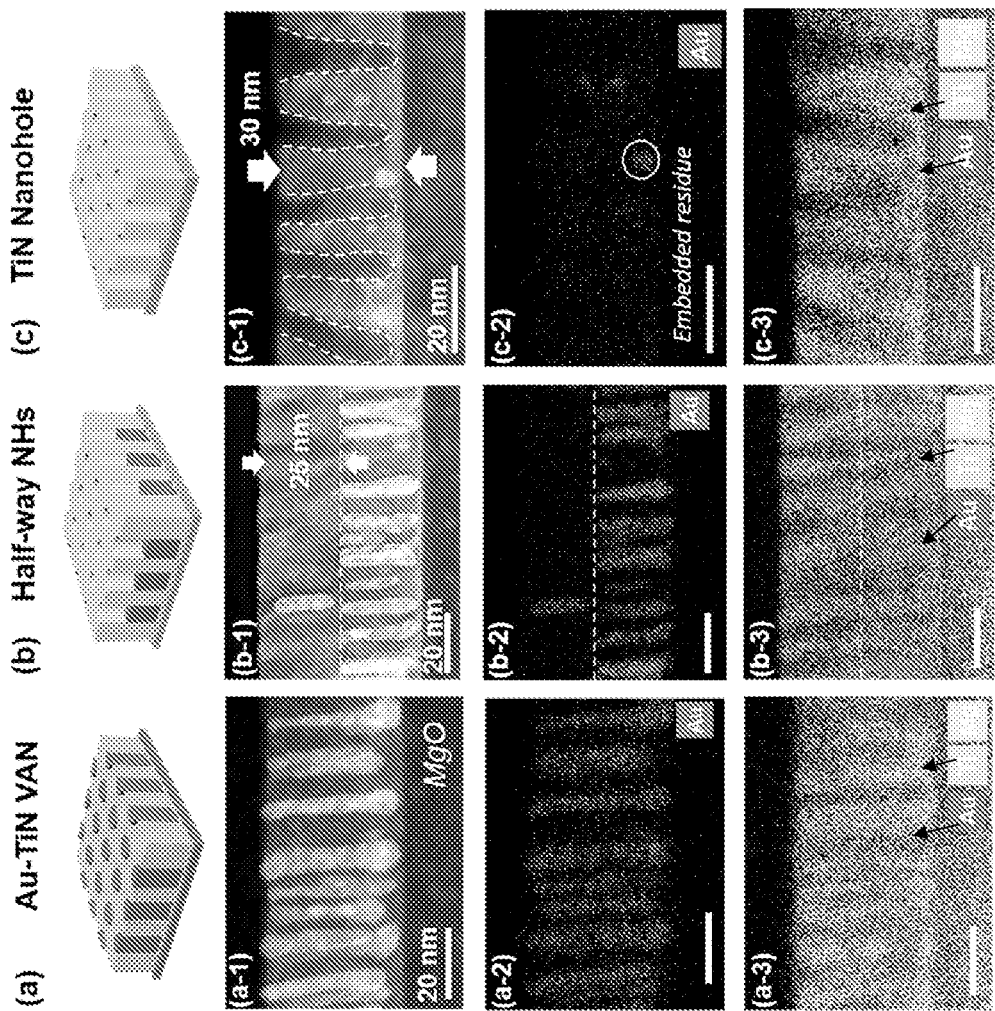
FIGs. 1a, 1a-1, 1a-2, 1a-3, 1b, 1b-1, 1b-2, 1b-3, 1c, 1c-1, 1c-2, and 1c-3

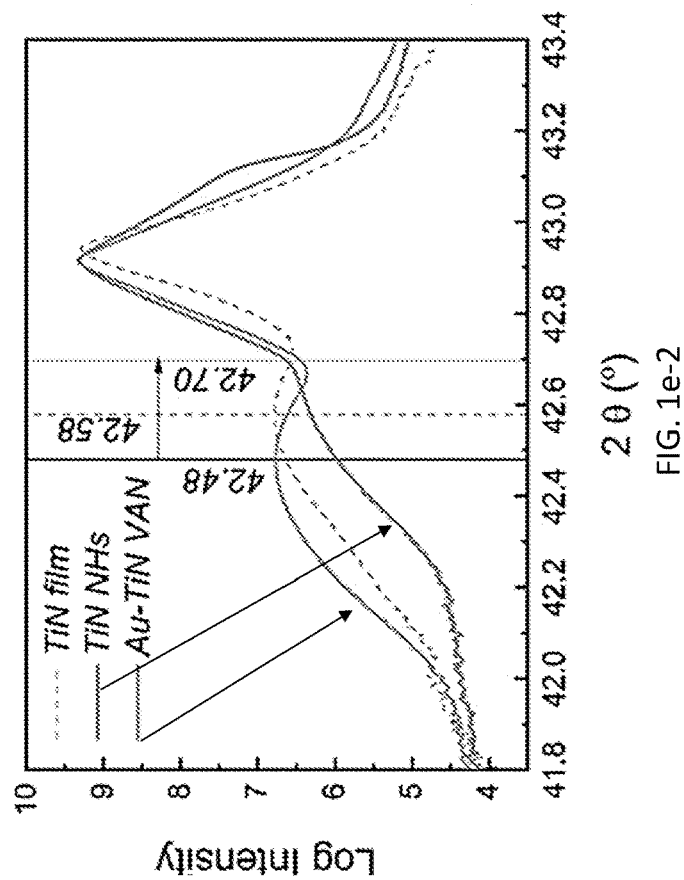
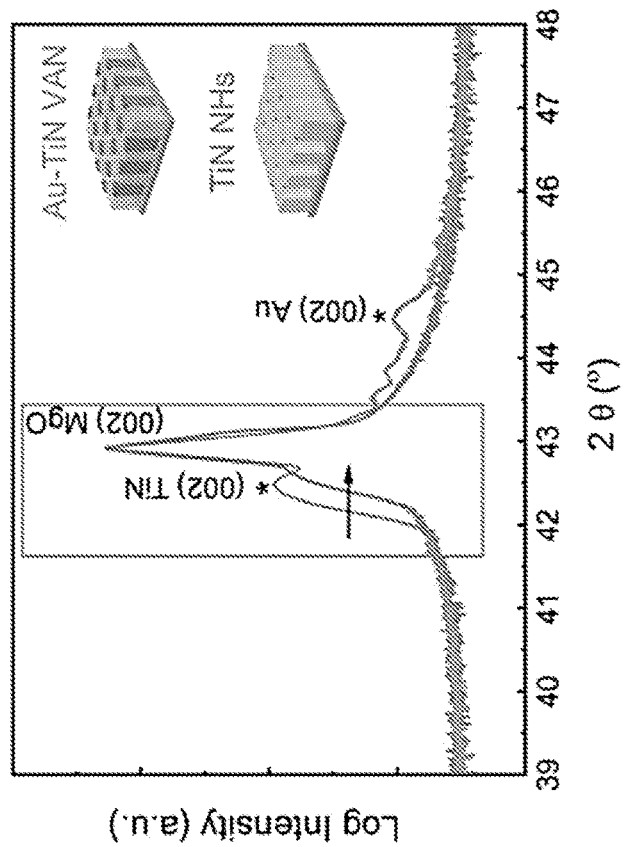
FIG. 1e-2
FIG. 1e-1

LARGE-SCALE PLASMONIC HYBRID FRAMEWORK WITH BUILT-IN NANOHOLE ARRAYS AS MULTIFUNCTIONAL OPTICAL SENSING PLATFORMS

RELATED APPLICATIONS

The present patent application is a 35 U.S.C. § 371 Nationalization Application of and claims the priority benefit of the International Patent Application Serial No. PCT/US21/16657 filed Feb. 4, 2021, which is related to and claims the priority benefit of U.S. Provisional Patent Application Ser. No. 62/970,948 filed Feb. 6, 2020, the contents of each of which are hereby incorporated by reference in its entirety into the present disclosure.

STATEMENT REGARDING GOVERNMENT FUNDING

The innovation associated with the present disclosure was not made with government support.

TECHNICAL FIELD

The present disclosure generally relates to a method of fabricating nanostructures, and in particular, to a method of fabricating metal-nitride vertically aligned nanocomposites.

BACKGROUND

This section introduces aspects that may help facilitate a better understanding of the disclosure. Accordingly, these statements are to be read in this light and are not to be understood as admissions about what is or is not prior art.

Light coupling with periodic patterned subwavelength hole array induces extraordinary optical transmission (EOT) beyond the standard aperture theory. Two characteristics, plasmonic material that supports surface plasmon (SP) modes as well as holes at subwavelength scale (or called "nano-hole", "nano-cavity", "nano-apertures"), necessitate the strong excitation of the electromagnetic field that is sensitive to the change of local refractive index, making the structure ideal for alternative surface plasmon resonance (SPR) sensors. For example, a microfluidic device fabricated from Au nanohole film on chip has been demonstrated, with high sensitivity of refractive index chemicals and real-time protein binding detection.

On the other hand, applying the nanohole film with functional materials provides a direction towards new device integration. Examples include SP lasing by placing optically pumped semiconductor gain layer in close proximity of a metal hole array, plasmon-controlled fluorescence (PCF) using colored fluorophores coupled with Ag nanohole film, or enhanced surface-enhanced Raman spectroscopy (SERS) signal from a single-layer graphene on top of Ag-covered polymer nanohole array.

The next-generation photonic device posts high demand on tunable responses at nanoscale or enhanced functional performance under harsh conditions. To this end, the advances on fabrication techniques and new materials are of great importance. Common method of nanohole fabrication includes a metal film deposition via sputtering or e-beam evaporation technique, followed by the "perforation" process using focused ion-beam (FIB) milling or lithography. The nanohole array fabricated by the above methods possesses desired ordering over hundreds of micrometers, parameters such as periodicity and hole dimensions can be controlled down to ~50 nm scale. Aside from round-holes, geometries including elliptical, squared-hole, double-hole, or patched nanohole arrays have been demonstrated. Either FIB or lithography involves a long-time writing process or multi-step processing before getting the final structure.

A new method called "template stripping", first demonstrated in 2009, is capable of patterning plasmonic nanostructures (i.e. nanohole array) in a large scale (e.g., cm range) and can be easily peeled off for free-standing functional substrate. However, one common challenge in all existing techniques is to further shrink the nanohole dimensions without quality deterioration. Manufacture of sub-10 nm feature sizes with rapid production are needed for modern-day surface plasmon resonance, and such feature-sizes are not within the ambit of prior art techniques. Such feature sizes even if achievable by focused ion beam techniques are not practicable for large surface and/or high volume manufacturing.

Therefore, there is an unmet need for a novel approach to provide nm-sized nanohole arrays that can be fabricated using large scale manufacturing methods.

SUMMARY

A method of fabricating a nanohole template is disclosed. The method includes growing vertically aligned nanocomposites having a plurality of nanoholes with metal disposed therein. The method also includes selectively wet chemical etching the metal with an etchant to a predetermined level.

According to one embodiment of the method, the growing vertically aligned nanocomposites includes:
applying a pulsed laser onto a composite target at an angle, the composite target is composed of a hybrid metal-nitride with majority volume percentage of nitride;
depositing adatoms of the composite target onto a heated substrate, the substrate having a nitride layer dispersed thereon and metal seeds provided as small islands dispersed over the substrate; and
nucleating metal over the small islands seeds and growing nitride over the nitride layer until a predetermined size of vertically aligned metal nitride nanocomposite is achieved.

According to one embodiment of the method, the selective wet chemical etching the metal includes:
using droplets of fresh acid etchant solution for a predetermined amount of etching time, until a predetermined amount of metal is removed.

According to one embodiment of the method, the predetermined amount of time is between about 10 s to about 30 s.

According to one embodiment of the method, the metal is Au.

According to one embodiment of the method, the acid etchant solution is fresh AQUA REGIA ($HNO_3$:HCl).

According to one embodiment of the method, the selective wet chemical etching is controlled by adjusting etching time.

According to one embodiment of the method, wet chemical etching of metal to about 50% of the initial metal is achieved by wet chemical etching for between about 10 s to about 15 s.

According to one embodiment of the method, the selective wet chemical etching is controlled by adjusting concentration of the acid etchant.

According to one embodiment of the method, wherein the etchant is selected from the group consisting of potassium cyanide dissolved in distilled water, hydrochloric acid (32%)—nitric acid (65%), and methanol (99.8%)—nitric acid (65%).

A nanohole template is also disclosed. The nanohole template includes a substrate and a vertically aligned nanocomposite (VAN) structure disposed over the substrate. The VAN structure is a metal nitride having circular periodic nanoholes of about 2 nm to about 20 nm in diameter.

According to one embodiment of the nanohole template, the VAN structure includes a pitch (center-to-center distance) of about 5 nm to about 30 nm.

According to one embodiment of the nanohole template, the VAN structure includes a thickness representing height of the nanoholes of about 5 nm to about 1000 nm.

According to one embodiment of the nanohole template, the metal nitride is chosen from the group consisting of nitride material can be extended to other transition metal-nitrides, such as TiN, TaN, ZrN, HfN, and combinations thereof.

According to one embodiment of the nanohole template, the substrate material is selected from the group consisting of Si, $SiO_2$, MgO, $SrTio_3$, $LaAlO_3$, glass, and combinations thereof.

According to one embodiment of the nanohole template, further comprising metal disposed in the nanoholes immediately over the substrate.

According to one embodiment of the nanohole template, the metal nitride is chosen from the group consisting of nitride material can be extended to other transition metal-nitrides, such as TaN, ZrN, HfN, and combinations thereof.

According to one embodiment of the nanohole template, wherein the depth of the metal is between about 0% to about 100% of height of the nanoholes.

According to one embodiment of the nanohole template, wherein the metal is selected from the group consisting of Au, Ag, Co, Ni, Cu, Fe, Al, and alloys thereof.

According to one embodiment of the nanohole template, wherein the substrate material is selected from the group consisting of Si, SiO2, MgO, SrTio3, LaAlO3, glass, and combinations thereof.

BRIEF DESCRIPTION OF DRAWINGS

FIG. 1a is a schematic of an input vertically aligned nanocomposite (VAN) film, received as a starting structure for the methods of the present disclosure.

FIG. 1B is a schematic of a processed VAN film according to one embodiment of the methods of the present disclosure.

FIG. 1c is a schematic of a processed VAN film according to another embodiment of the methods of the present disclosure.

FIGS. 1a-1, 1b-1, and 1c-1 are high-angle annular dark-field (HAADF) scanning transmission electron microscope (STEM) of samples according to FIGS. 1a, 1b, and 1c, respectively.

FIGS. 1a-2, 1a-3, 1b-2, 1b-3, 1c-2 and 1c-3 are Energy Dispersive X-ray (EDX) elemental maps of Au (red), Ti (green) and Mg (blue) for FIGS. 1a, 1b, and 1c, respectively.

FIGS. 1e-1, 1e-2, 1e-3, and 1e-4 are X-ray diffraction (XRD) plots showing removal of Au nanopillar array from TiN matrix, according to the method of the present disclosure.

FIGS. 1f-1 and 1f-2 are SEM and EDX quantification of (a) Au—TiN and (b) TiN nanohole samples, respectively.

FIGS. 1g-1 and 1g-2 are plan view STEM images and corresponding EDX maps which confirm a well-distributed Au nanopillar assembly.

FIGS. 1g-3 and 1g-4 are histogram which show the averaged nanopillar diameter and its inter-pillar distance are quantified as about 6 nm and about 8 nm, respectively.

FIGS. 1g-5 and 1g-6 are additional plan-view images showing majority of the nanoholes are vertically aligned.

FIG. 3a is a STEM micrograph of plan-view Au—TiN VAN and corresponding IFFT images along [010], [100] directions; FIGS. 3b and 3c, 3d are STEM micrographs of cross-section view of Au—TiN VAN and corresponding IFFT images along [010] and [001] directions; FIGS. 3e and 3f, FIG. 3g are STEM micrographs of plan-view TiN nanohole film and corresponding IFFT images, FIGS. 3h, 3i, and FIG. 3j are STEM micrographs of cross-section view of TiN nanohole and corresponding IFFT images; and FIGS. 3k and 3l are STEM micrographs of cross-section view of Au—TiN VAN and corresponding IFFT images along [010] and [001] directions.

DETAILED DESCRIPTION

Figure 1D:
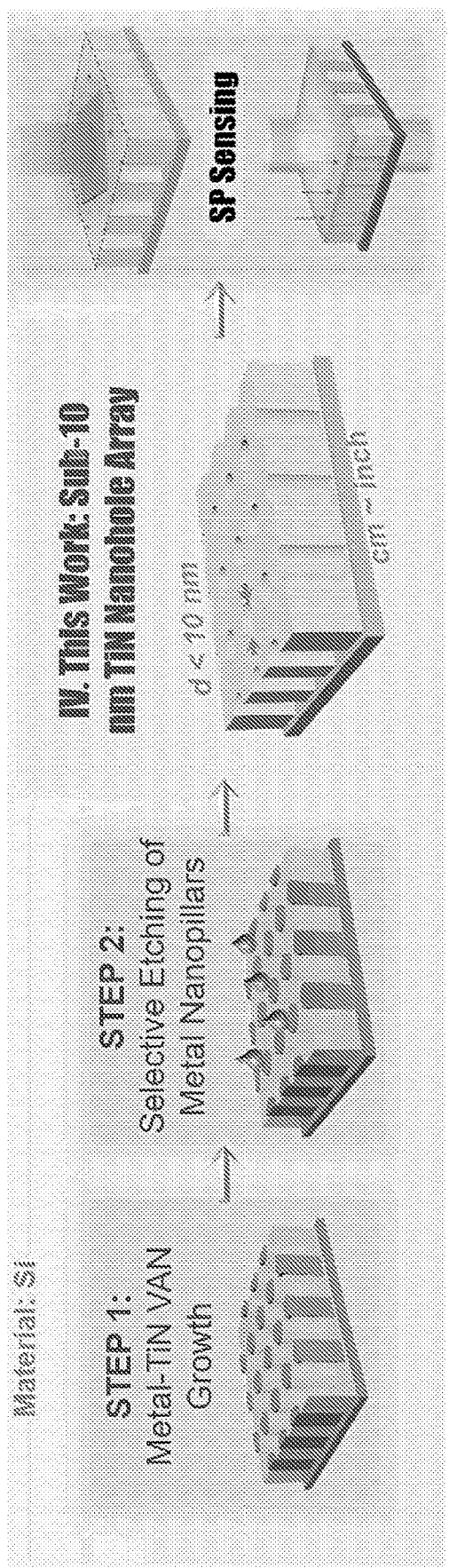
FIG. 1d is a schematic of the steps of the method according to one embodiment of the present disclosure.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

A novel approach is presented herein that can provide nm-sized nanohole arrays that can be fabricated using large scale manufacturing methods. According to the present disclosure once a deposited two-phase Au—TiN vertically aligned nanocomposite (VAN) film with periodic metal nanopillar array in a nitride matrix is provided as shown in FIG. 1a, which is a schematic of said VAN film, the method of the present disclosure includes selectively wet-etching the metallic phase (shown in FIGS. 1b and 1c). By controlling the etching process, nanostructured plasmonic frameworks with either half-way nanoholes (FIG. 1B) or full nanoholes (FIG. 1c); or any other amount of etching between zero etching to half etching (FIG. 1B) or full etching (FIG. 1c) by choosing an etchant, concentration, and time of etching, as known to a person having ordinary skill in the art, are demonstrated. TiN matrix is selected because of its unique high stability, high mechanical strength, chemical inertness, and high temperature low-loss plasmonic properties. Au is selected based the Au—TiN two-phase nanocomposites fabrication with tunable nanopillar density, while many other metals can also be implemented, as discussed therein. Upon either zero to half-way to complete removal of the metal phase, tunable optical properties are expected in terms of optical transmittance, complex dielectric properties, optical anisotropy, and surface plasmon resonance (SPR) properties. Robust and reusable SPR enhanced optical sensing platforms applying these nanohole arrays as "nano-cavities" and "nano-capillaries" are of great interests.

As discussed above, the nanohole array, according to the present disclosure, is generated by selective wet-etching of the metal (Au) phase from a high-quality Au (pillar)—TiN (matrix) VAN template, as illustrated in FIG. 1d. Details for fabrication are provided below. Chemical etching was performed by placing droplets of acids on top of the film as prepared by a fabrication methodology; parameters such as etchant ratio and condition, treatment time, liquid placement, as well as post-cleaning play important roles in achieving high quality nanoholes. The presented nanohole array owns advantages including well-distributed sub-10 nm feature with single crystalline quality and large throughput. Applying TiN for nanohole design enables low-loss plasmonic properties, high mechanical strength and chemical inertness.

Advantageously, such etching process can be precisely controlled so that the nanohole framework with either half-way etched or fully etched holes or degrees of etching in between are created. Upon removal of the metal phase, tunable optical properties are measured in terms of optical transmittance, complex dielectric function, optical anisotropy, and SP-related properties. These robust and reusable nanohole arrays as solid-state thin-film form are of great interest for SP enhanced plasmonic imaging, label-free bio-medical sensing, solar energy harvesting, all-optical photonic circuits, and other application, known to a person having ordinary skill in the art.

Figures 1, 1E, 2, 3, 4:
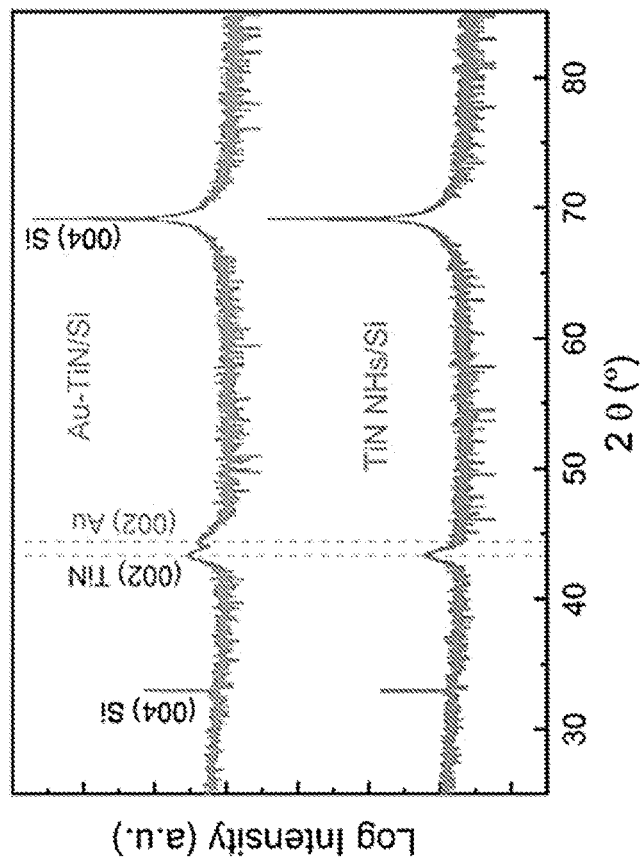
Figures 1, 1E, 2, 3:
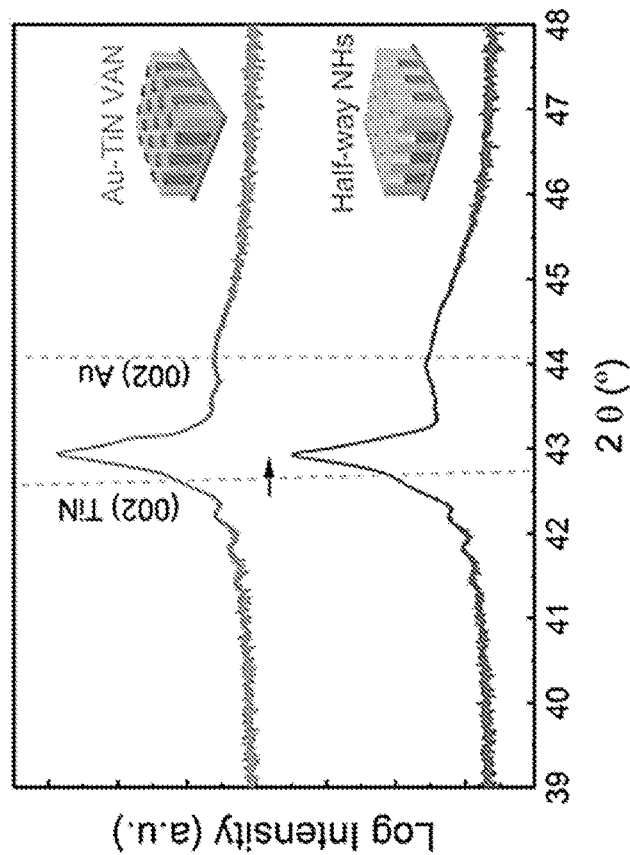
Figures 1, 1F, 2:
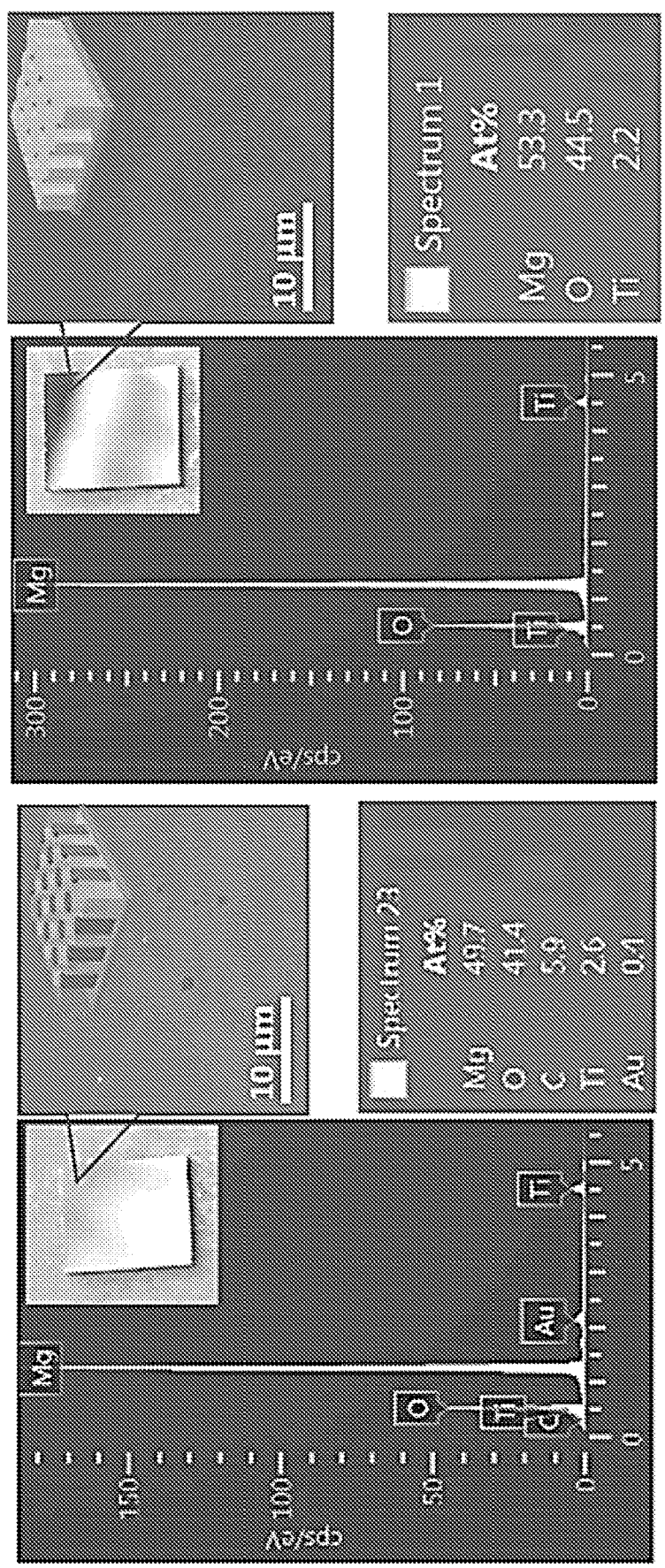

The removal of Au nanopillar array from TiN matrix was first explored over a large surface area using X-ray diffraction (XRD). FIG. 1e-1 displays the θ-2θ scans of the as-deposited Au—TiN VAN template and the fully etched TiN nanohole films grown on (001) MgO. The two scans are plotted at the same scale to visualize the difference. It is clear that the Au (002) peak at 2θ=44.486° disappears after etching while TiN (002) maintains its peak intensity and sharpness, indicating desired crystalline quality unaffected by the etching process. Another important feature is the right shift of TiN (002). Therefore, a detailed θ-2θ scan was performed, as shown in FIG. 1e-2. The pure TiN film exhibits a (002) peak at 42.58° which is close to its bulk value (2θ=42.59°), while the TiN (002) peak (vertical lines) of the as-deposited Au—TiN and fully etched TiN nanoholes experiences a pronounced right shift from 42.48° to 42.70°. This phenomenon strongly correlates to an out-of-plane compressive strain upon the removal of the Au phase, as will be discussed in detail in high-resolution scanning transmission electron microscopy (HRSTEM) analysis. FIG. 1e-3 shows another set of scans comparing the as-deposited Au—TiN and a half-way etched sample. A similar right shift of TiN (002) has been observed in both samples, while the Au (002) peak is maintained with a reduced intensity as Au is etched half-way. The etching experiment was also performed for the films integrated on (001) Si substrate to demonstrate the capability of on-chip device integration. As shown in FIG. 1e-4, the Au (002) is removed. Energy Dispersive X-ray (EDX) and scanning electron microscopy (SEM) were performed over a large film area to collect the elemental spectrum, atomic quantification as well as surface morphology. As shown in FIGS. 1f-1 and 1f-2, the Au concentration in Au—TiN VAN is 13.3 at. % while the signal in the etched sample is below the detection limit. Note that the color of the sample (insets) changes from shiny goldish into gold-brownish as shown in the inset images of FIGS. 1f-1 and 1f-2.

Figures 1, 1G, 2:
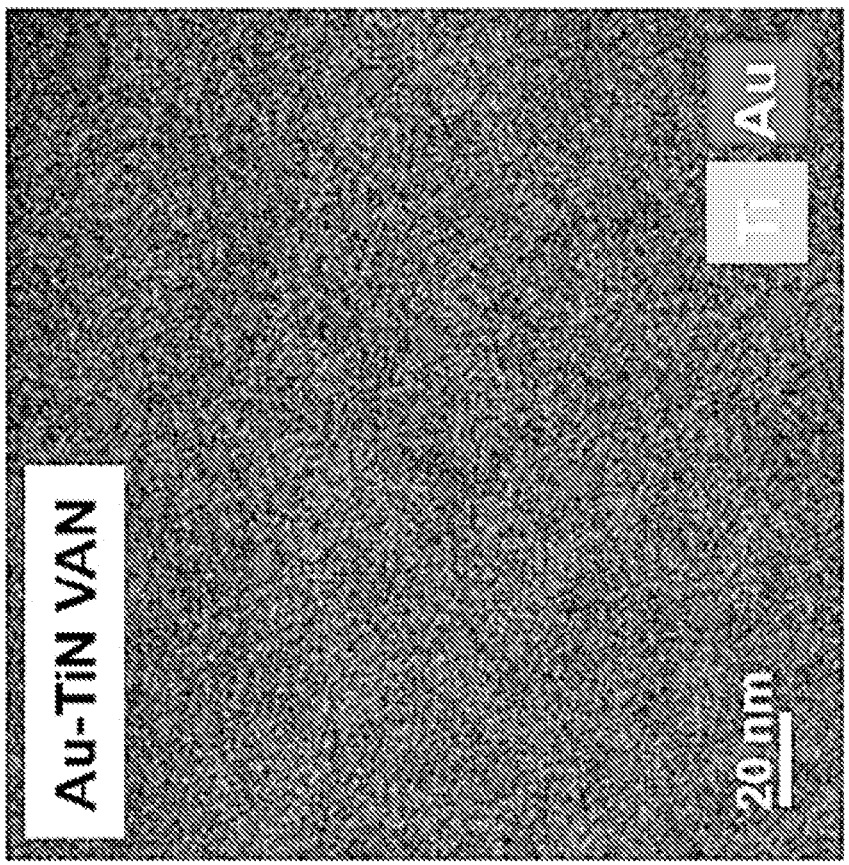
Figures 1, 1G:
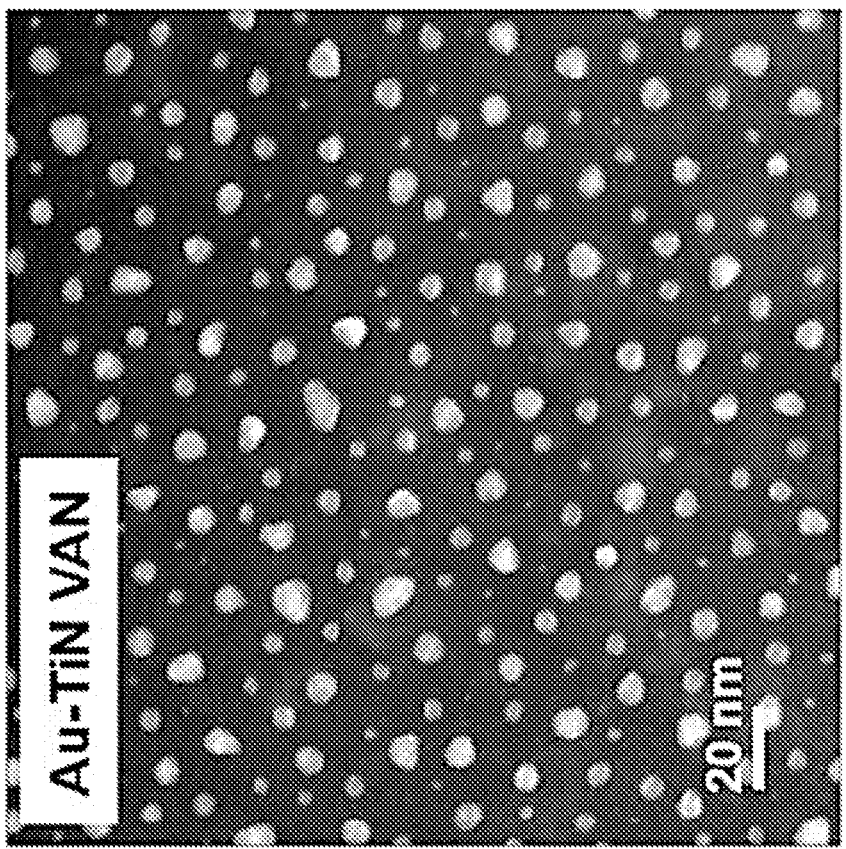
Figures 1, 1G, 2, 3, 4:
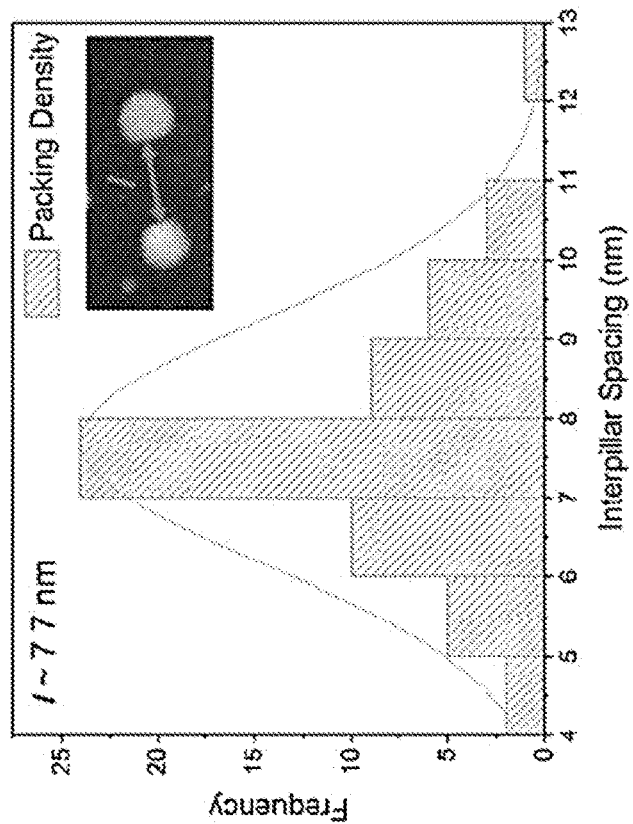
Figures 1, 1G, 2, 3:
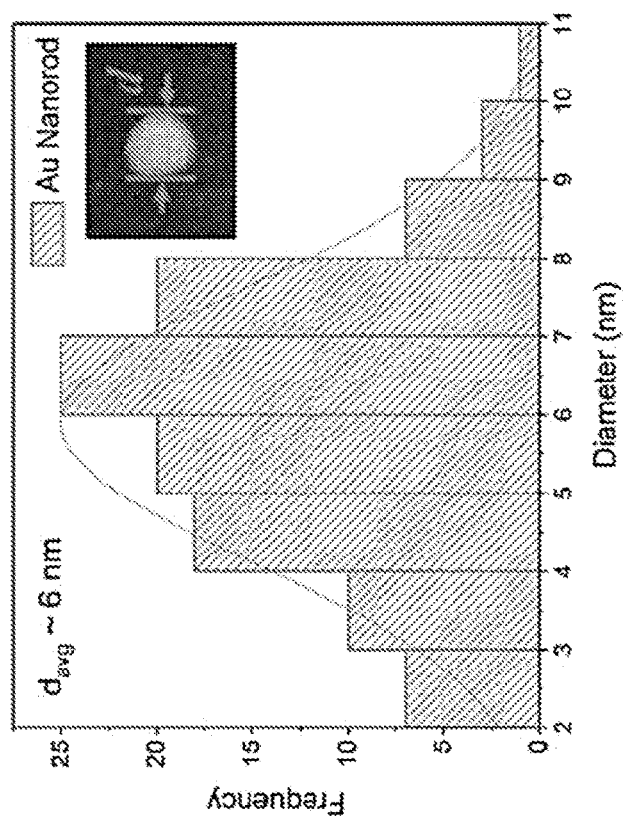
Figures 1, 1G, 2, 3, 4, 5, 6:
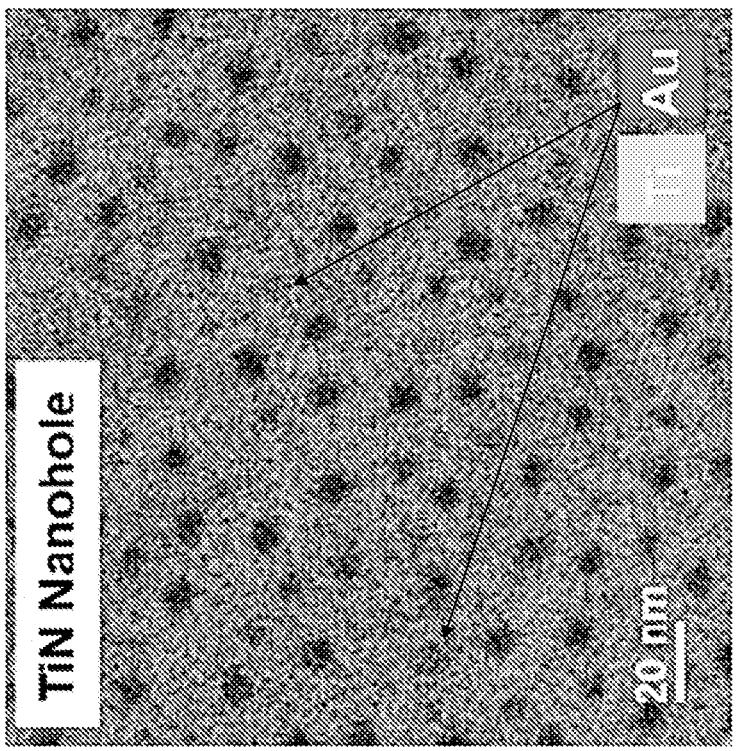
Figures 1, 1G, 2, 3, 4, 5:
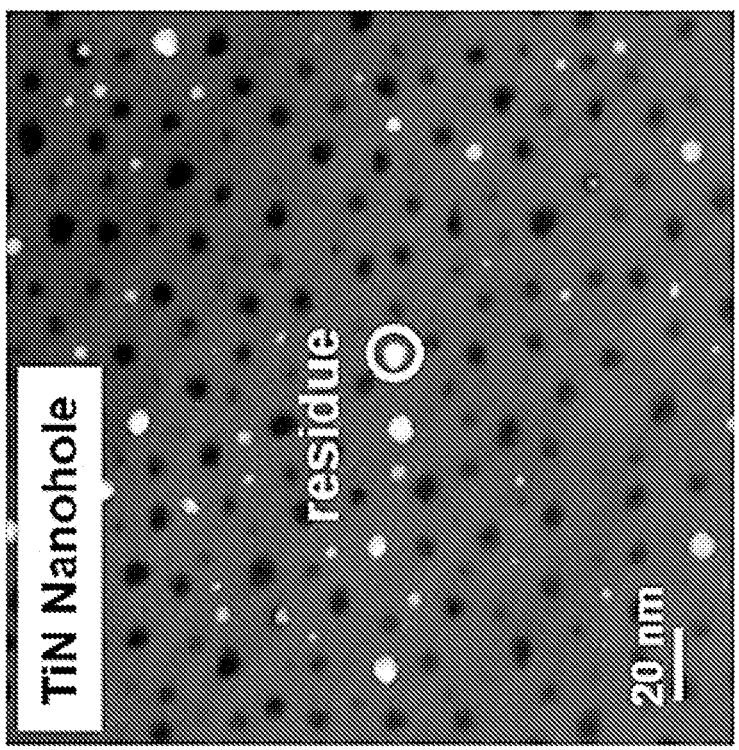
Figures 2A, 2B, 2C, 2D, 2E, 2F, 2G, 2H:
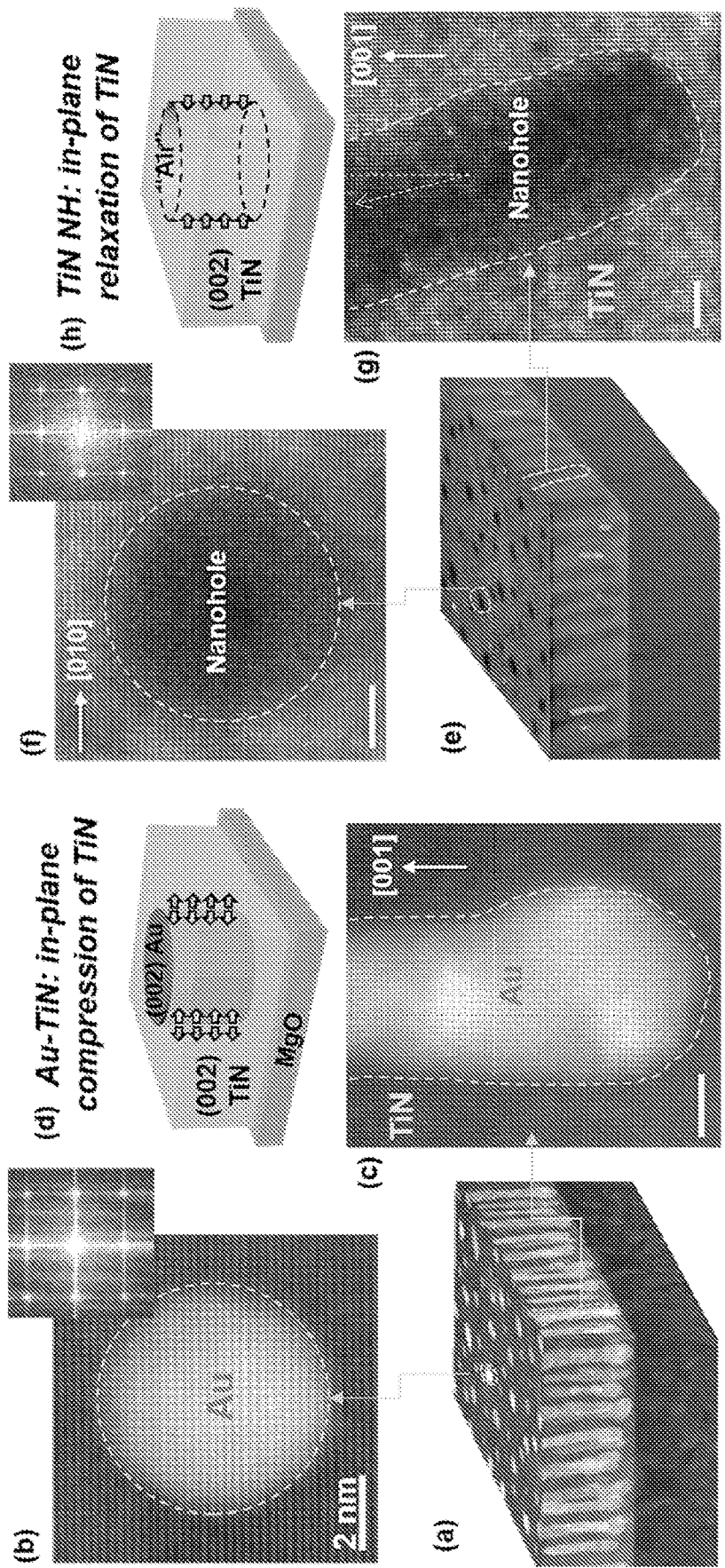
FIGS. 2a and 2e are three-dimensional morphologies of Au—TiN VAN and TiN nanohole samples reconstructed from cross-section and plan-view images, with areas of interests (AOIs) marked by dashed lines.
FIGS. 2b, 2c, 2f, and 2g are corresponding HRSTEM images from AOIs shown in FIGS. 2a and 2e.
FIGS. 2d and 2h are schematics showing strain relaxation mechanism of the structure subjected to the method of the present disclosure.

Microscopic analysis from three dimensions was performed using high-angle annular dark-field (HAADF) STEM. As revealed from FIG. 1a-1, Au—TiN template film is grown with distinctive phase boundary and well-distributed Au nanopillars. Upon etching, the Au phase is effectively removed and this process can be controlled half-way (FIGS. 1b-1 and 1c-1), or other proportions for etching, leaving clean "air"/TiN interfaces without morphological change. It is noted that the results shown here are selected from three different samples, and the variation on film thickness is due to the run-to-run variations under similar growth conditions. The mechanically and chemically inert TiN matrix plays an important role in maintaining the nanostructure upon acid etching, as compared to oxides or noble metals we explored (data not shown). EDX elemental maps (FIGS. 1a-2, 1a-3, 1b-2, 1b-3, 1c-2 and 1c-3) of Au (red), Ti (green) and Mg (blue) confirm the effectiveness of nanohole production, though there are few Au residues embedded in TiN therefore inaccessible by acids. This indicates that a high efficiency nanohole fabrication requires a high-quality nanocomposite template with continuous and uniform nanopillars. Next, plan view STEM images and corresponding EDX maps (FIG. 1g-1 and 1g-2) from Au—TiN VAN confirm the well-distributed Au nanopillar assembly. According to the histogram (shown in FIGS. 1g-3 and 1g-4), the averaged nanopillar diameter and its inter-pillar distance are quantified as about 6 nm and about 8 nm, respectively. For TiN nanohole film, the Au (high-Z) pillars with bright contrast now become "air gaps" with dark contrast (as shown in FIGS. 2a and 2b), indicating the effective removal of Au. Based on plan view images, the area (about volume) fraction of the secondary phase was calculated. A change in the volume fraction from about 15.47% (Au) to about 12.4% (air) indicates that an approximate 80.16% etching efficiency was achieved.

Figures 3A, 3B, 3C, 3D, 3E, 3F:
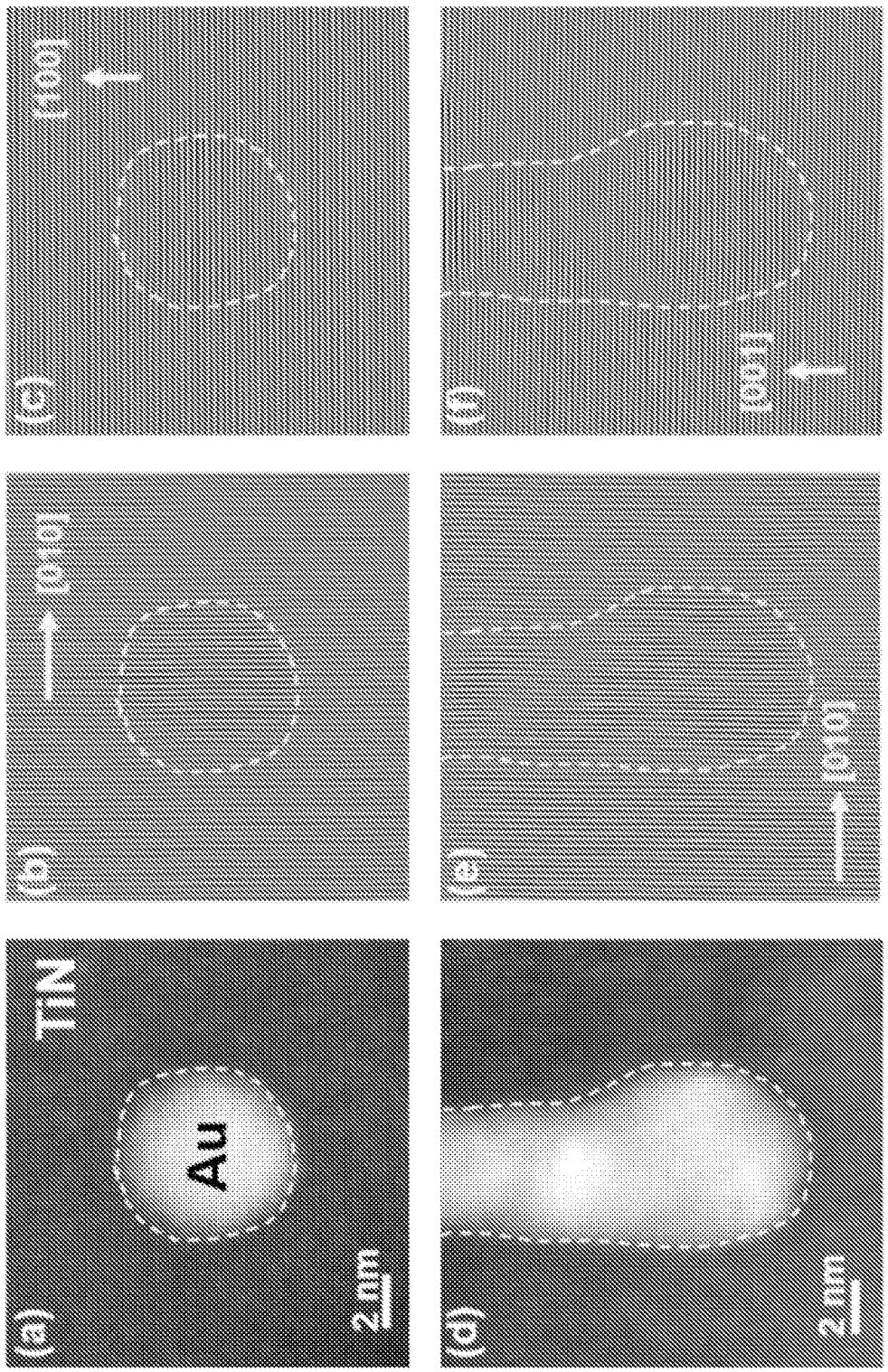
FIGS. 3a, 3b, 3c, 3d, 3e, 3f, 3g, 3h, 3i, 3j, 3k, and 3l are inverse fast Fourier transform (IFFT) images which show strain analysis using IFFT; in particular.
Figures 3G, 3H, 3I, 3J, 3K, 3L:
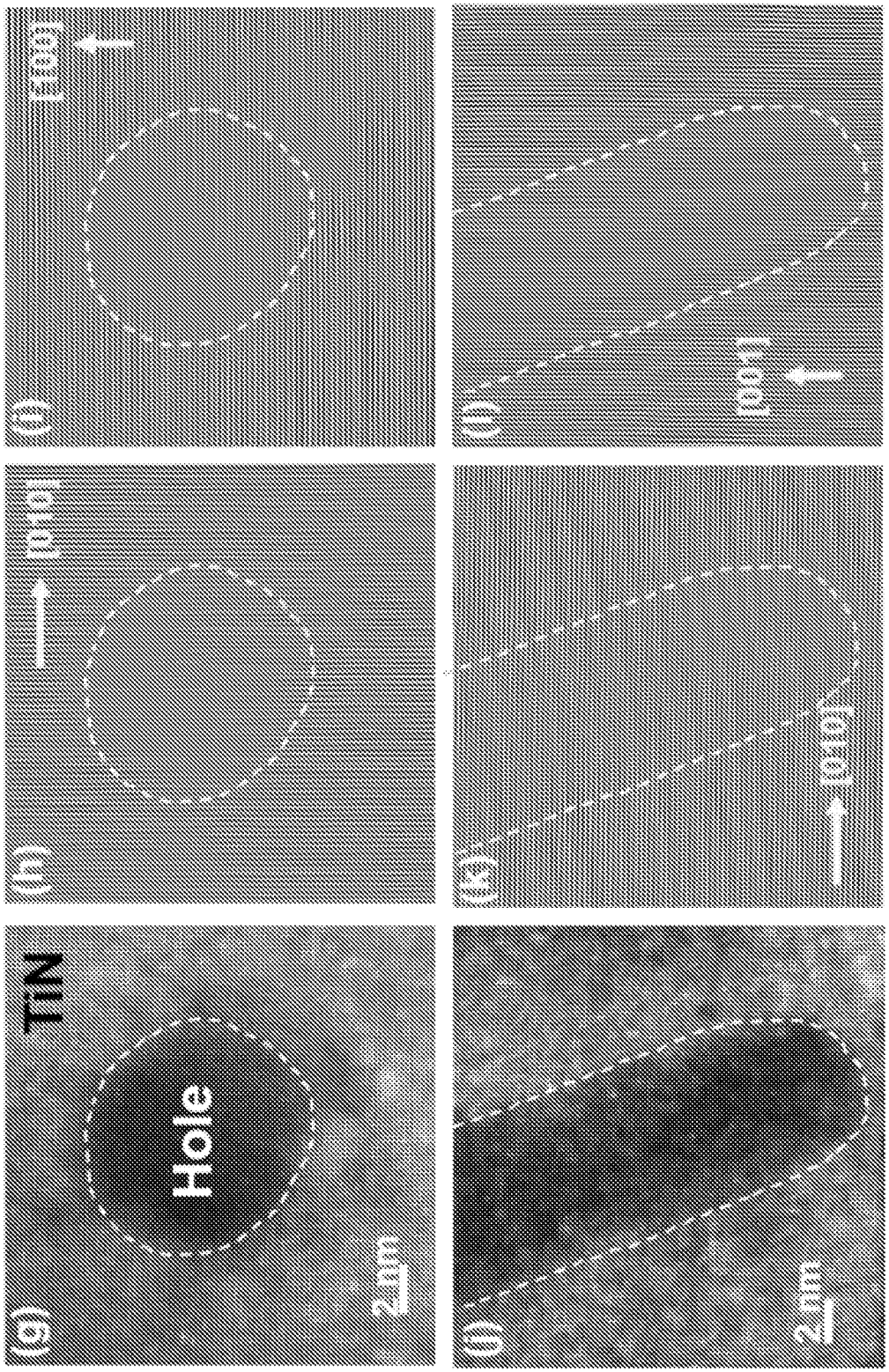

In order to understand the mechanism and changes of strain state during the etching process, HRSTEM micrographs were collected at phase boundaries for both the as-deposited and the etched samples. FIGS. 2a and 2e show the three-dimensional morphologies of Au—TiN VAN and TiN nanohole samples reconstructed from cross-section and plan-view images, with areas of interests (AOIs) marked by dashed lines. Corresponding HRSTEM images from AOIs are shown in FIGS. 2b, 2c, 2f, and 2g. Aside from a pronounced contrast variation created by removing Au, there is no change in terms of strain contours or defect formation (i.e. misfit dislocations), which is further confirmed by the inverse fast Fourier transform (IFFT) images as shown in FIGS. 3a, 3b, 3c, 3d, 3e, 3f, 3g, 3h, 3i, 3j, 3k, and 3l (which show strain analysis using inverse fast Fourier transition (IFFT); in particular, FIG. 3a is a STEM micrograph of plan-view Au—TiN VAN and corresponding IFFT images along [010], [100] directions; FIGS. 3b and 3c, 3d are STEM micrographs of cross-section view of Au—TiN VAN and corresponding IFFT images along [010] and [001] directions; FIGS. 3e and 3f, FIG. 3g are STEM micrographs of plan-view TiN nanohole film and corresponding IFFT images; FIGS. 3h, 3i, and FIG. 3j are STEM micrographs of cross-section view of TiN nanohole and corresponding IFFT images; and FIGS. 3k and 3l are STEM micrographs of cross-section view of Au—TiN VAN and corresponding IFFT images along [010] and [001] directions. The film maintains single crystalline quality as revealed from the local diffraction patterns (inset images), and the shading of contrast (about 1 nm) at air/TiN boundaries (see FIGS. 2f and 2g) is owing to the lattice coupling originates from the Au—TiN VAN. Note that the atomic scale cross-sectional interface in FIG. 2g exhibits slight tilting about 12°, such tilting is potentially caused by the in-plane relaxation upon removal of Au or thermal-energy minimization, while majority of the nanoholes are vertically aligned as revealed from uniform contrast as shown in plan-view images (as seen in FIGS. 1g-5 and 1g-6). The strain relaxation mechanism is explained using a simple model as shown in FIGS. 2d and 2h. Originally, TiN suffers an in-plane compression (green arrows in left panel) due to the two-phase growth as vertical mode, which results in an out-of-plane tensile stress as seen by its decreased 2θ values (see FIG. 1e-2). However, the removal of Au phase induces a strong in-plane relaxation (green arrows in right panel) which results in reduction of d-spacing out-of-plane. Here, the selection of (001) MgO substrate plays a crucial role to compensate the in-plane strain of TiN and ensure the (001) atomic stacking of the nanohole film.

Figures 4A, 4B, 4C:
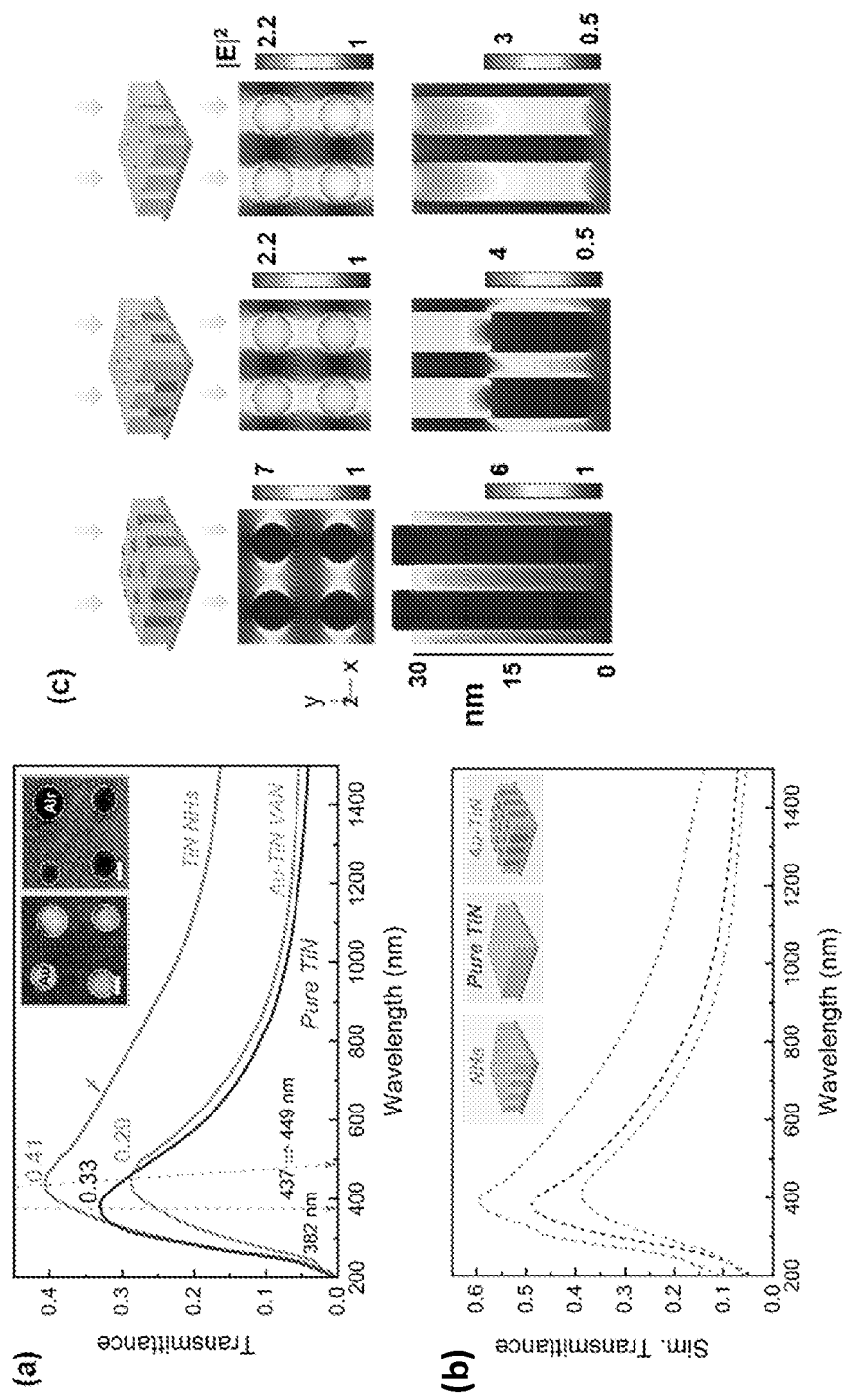
FIG. 4a is a graph of transmittance vs. wavelength which shows optical properties by measuring the light transmission through the nanohole thin films.
FIG. 4b is a graph of angular transmittance vs, wavelength showing angular dependent transmittance spectra of between about 0° to about 24° of the nanohole film.
FIG. 4c is a three-dimensional field mapping ($|E^2|$) at 400 nm for AU-TiN, half-way TiN nanoholes, and TiN nanohole films.
Figure 4D:
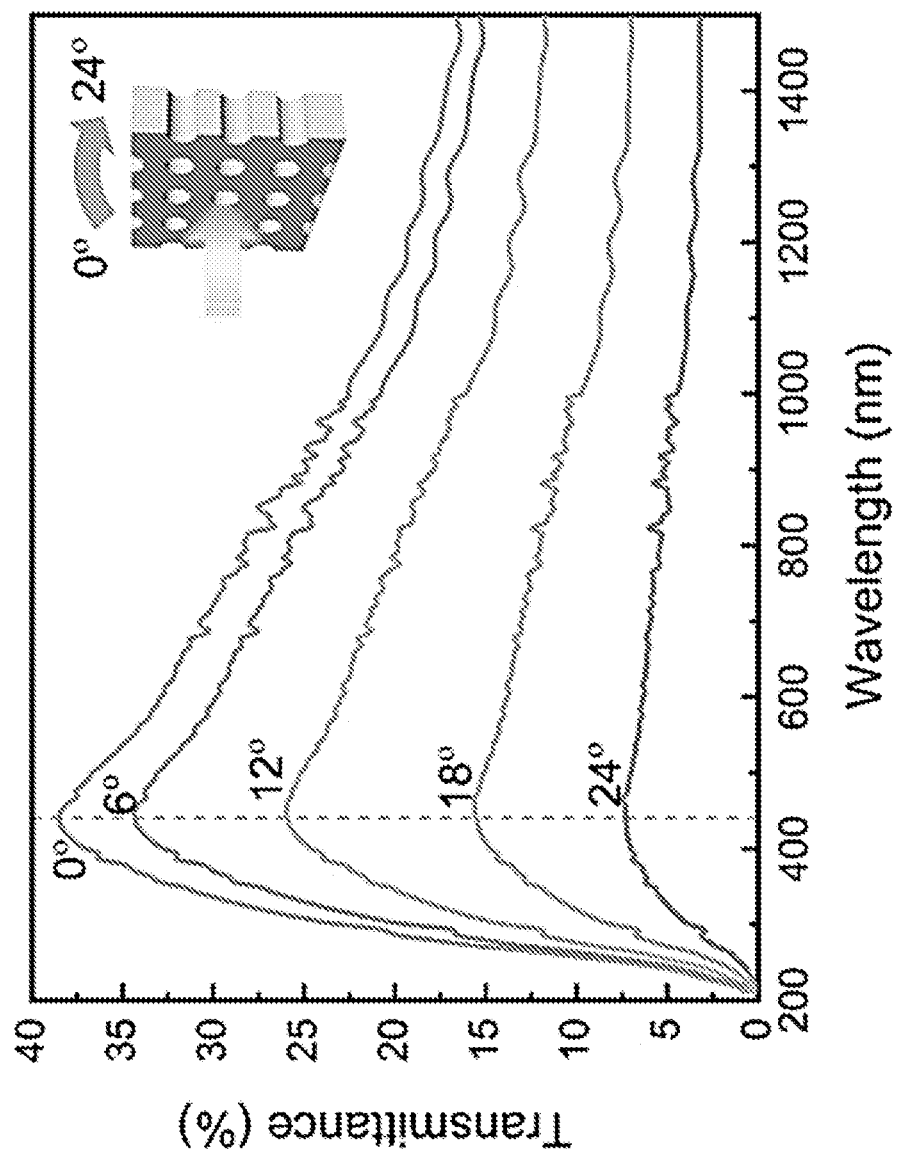
FIG. 4d is another graph of transmittance vs. wavelength showing angular dependent transmittance (%) spectra collected with incident angles from 0° to 24° depicting a significant decrease of the intensity close to resonance frequency (7% at 24° incidence).

Optical properties were first explored by measuring the light transmission through the nanohole thin films. Pure TiN film and Au—TiN VAN film were measured as the reference. Results of transmittance (zero order, Too) spectra are coupled in FIG. 4a. In the measured spectrum range (200 nm to 1500 nm), plasmonic resonances occur close to 400 nm for all samples without pronounced shifts. However, the transmittance of TiN nanohole film reaches 0.41 with extended resonance linewidth approaching near infrared, as compared to pure TiN (0.33) and Au—TiN (0.29). Such expansion is contributed by an additional resonance on the right (marked by the red arrow), which is correlated with the strong SP generated at the nanohole/air interface. If dividing Too by the area fraction of the nanoholes (12.47%), the enhancement factor reaches about 1 and can be further enhanced with higher etching efficiency. Different from the previous reports on extraordinary optical transmittance (EOT) effect induced by plasmonic hole arrays with diameters comparable to wavelength of incident light, the enhancement here is rather moderate due to a much finer nanohole array (6 nm) and the ultra-thin TiN layer nucleated at the bottom during VAN growth. Angular dependent transmittance spectra of the nanohole film are displayed in FIG. 4d (which shows angular dependent transmittance (%) spectra collected with incident angles from 0° to 24°: showing a significant decrease of the intensity close to resonance frequency (7% at 24° incidence)), indicating an angular sensitivity of the vertically aligned nanoholes. Next, optical models based on the nanostructures were built to retrieve the electric field distribution and optical spectra. The simulated spectra at the same wavelength range are shown in FIG. 4b, demonstrating a reasonable agreement with the measurement results. A slight red shift of peak resonance occurs in both measured and simulated curves, such phenomenon, as explained in previous studies, is largely owing to the interference between direct transmission through the nanoholes and the resonant excitation of the SP modes. Theoretical predictions by Fan, et al. suggest that such SP mode always exists regardless of how small the holes are. In addition, a single hole with small dimension supports a stop band just above the surface plasmon frequency such that it can be applied as bandpass filter to control light transmission. The SP property of the TiN nanohole was predicted by the electric field ($|E|^2$) maps retrieved at 400 nm. Field maps from top and cross-sectional projections of Au—TiN, half-way removed, and the nanohole films are presented in FIG. 4c. The Au—TiN template exhibits a localized surface plasmon resonance (LSPR). Once Au is removed, enhanced collective excitation and near-field interactions occur at nanohole edges, which allow the propagation of SPs with much smaller field decay. The switching from LSPRs to SPs enables surface sensing as demonstrated in the last section.

Figures 5A, 5B:
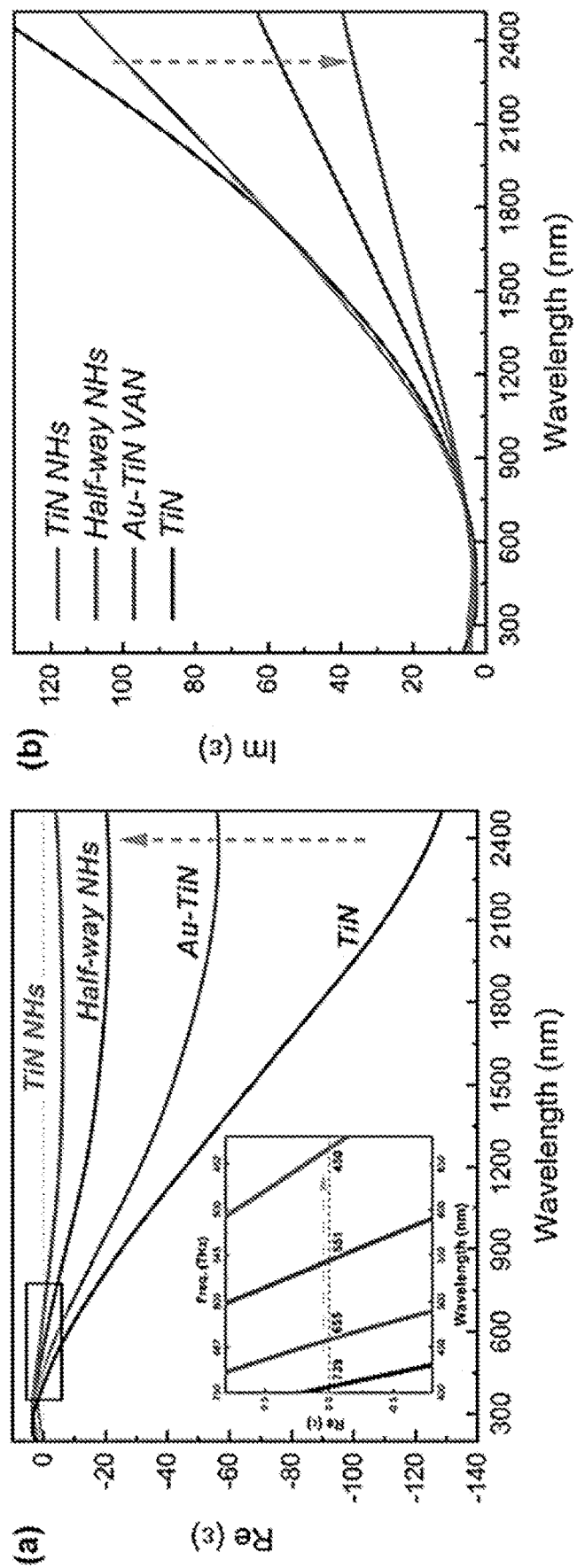
FIGS. 5a, 5b, 5c, and 5d are graphs of real and imaginary components of dielectric, in particular, constant of TiN nanohole films stacked with reference samples including half-way TiN nanohole, Au—TiN and pure TiN films (FIG. 5a— the inset shows the plasmon frequencies), the imaginary components of the dielectric constants of four samples (FIG. 5b), in-plane and out-of-plane dielectric constant of the nanohole film (FIG. 5c-insets depict provide the selected k-space profile), and in-plane and out-of-plane dielectric constant of pure TiN film (FIG. 5d).
Figures 5C, 5D:
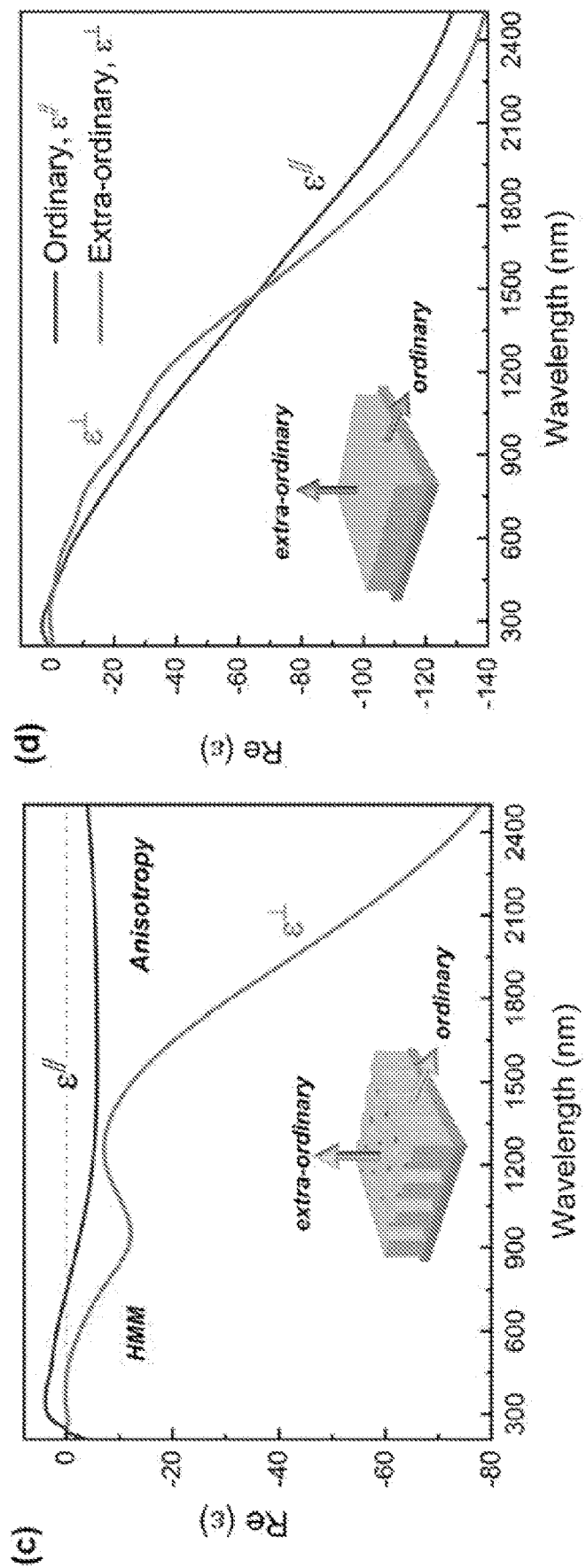
Figure 5E:
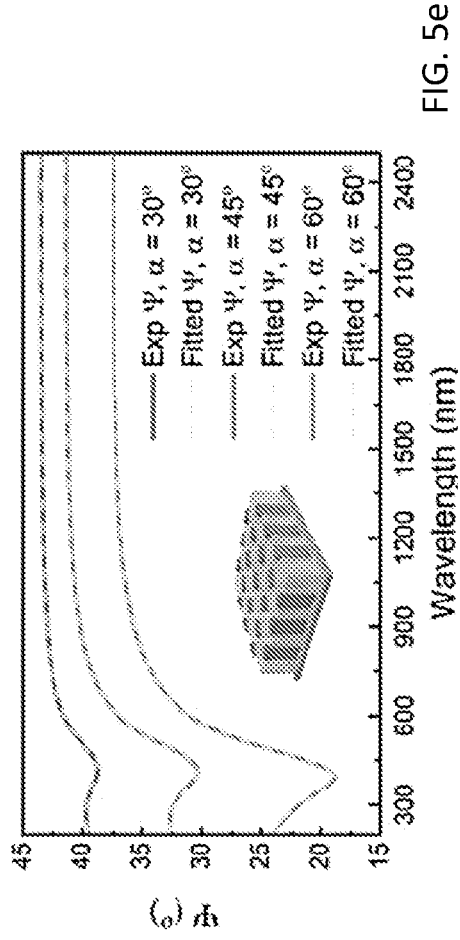
FIGS. 5e and 5f are angular resolved Ψ and Δ as a function of wavelength for the starting VAN Au—TiN film.
Figure 5F:
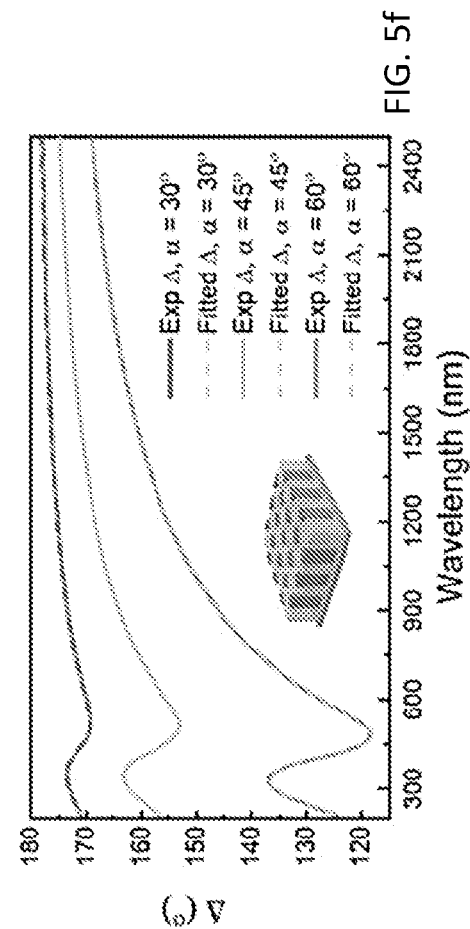
Figure 5G:
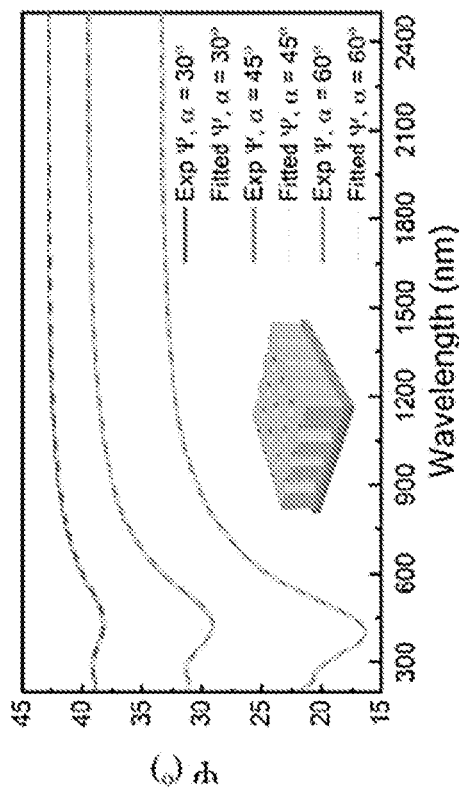
FIGS. 5g and 5h angular resolved Ψ and Δ as a function of wavelength for the ending nanoholes.
Figure 5H:
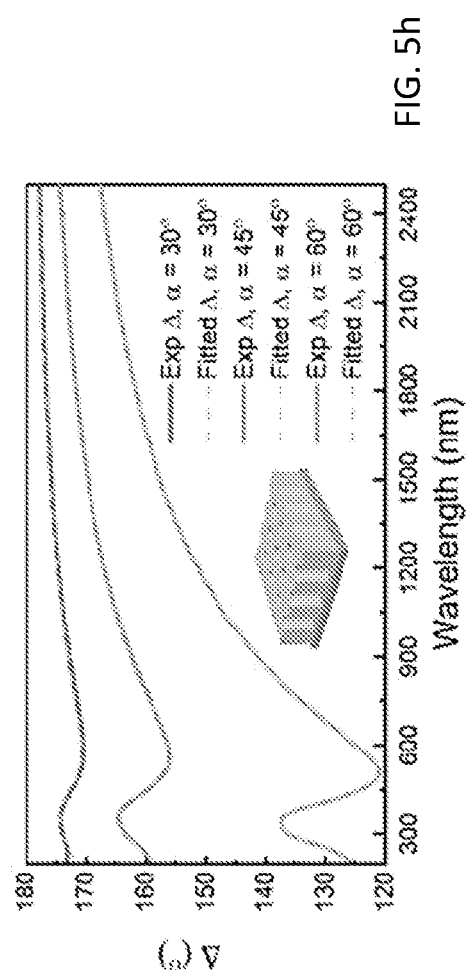
Figures 5I, 5J:
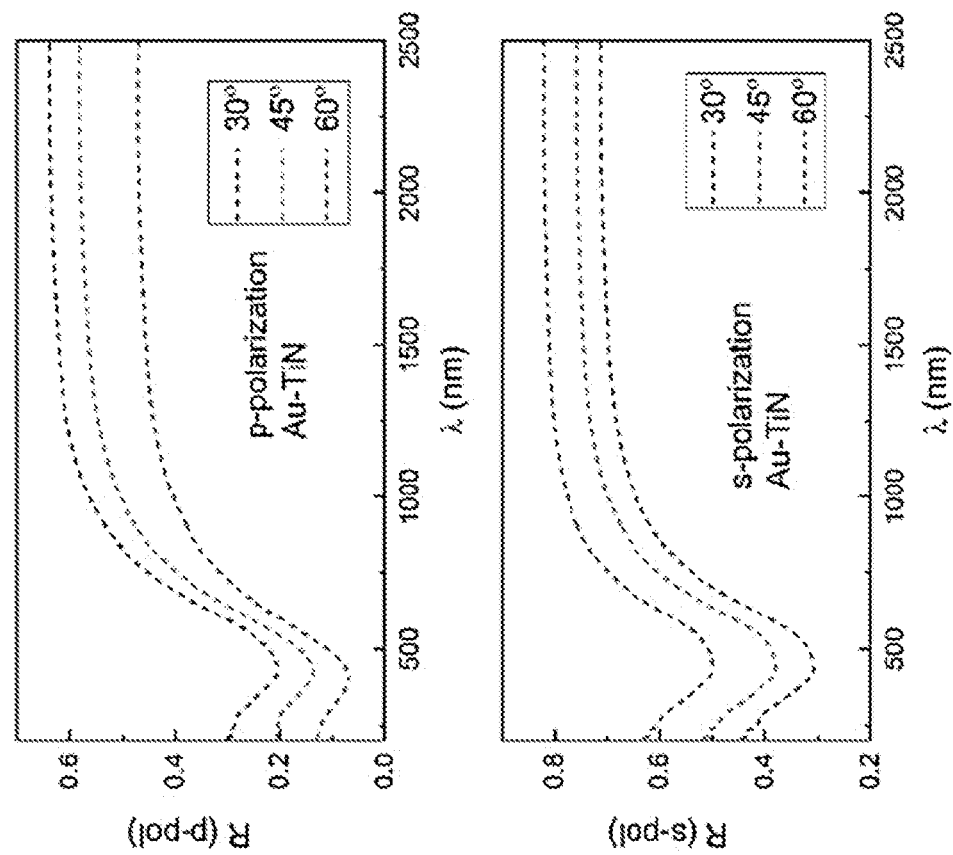
FIGS. 5i and 5j are s-polarized reflectance spectra vs. wavelength.
Figure 5K:
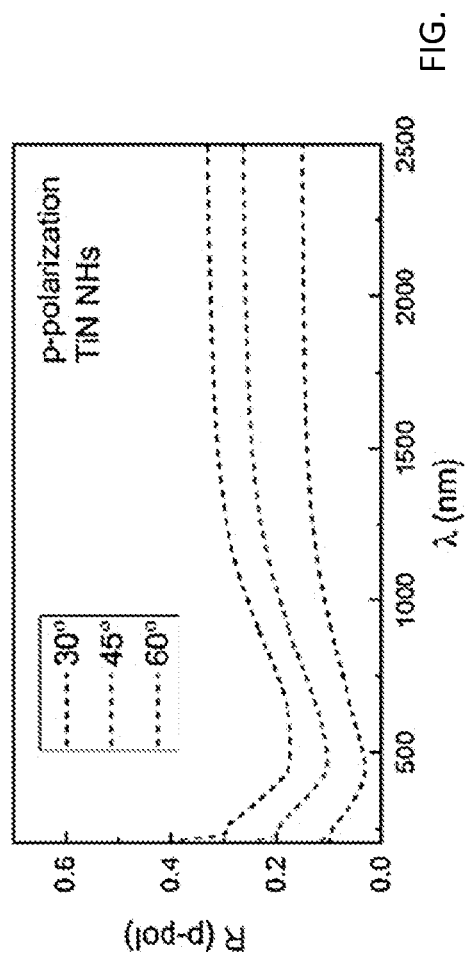
FIGS. 5k and 5l are p- and s-polarized reflectance spectra vs. wavelength.
Figure 5L:
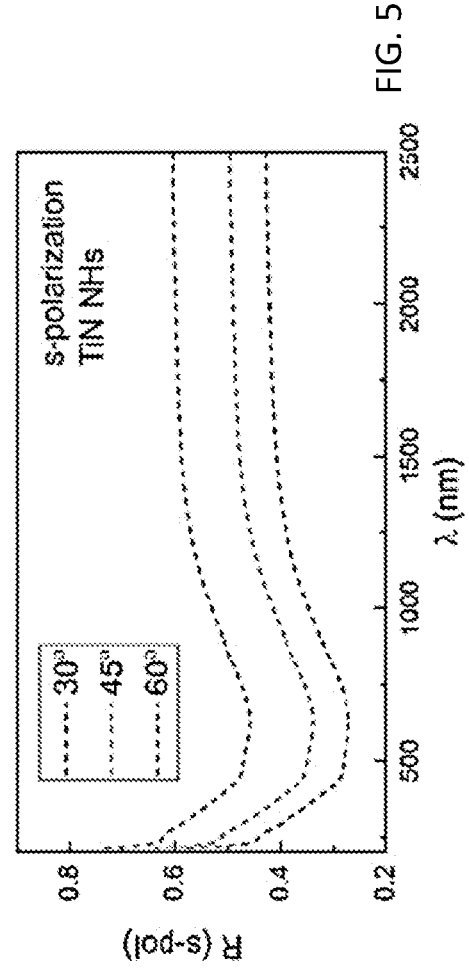

The dielectric constant of TiN nanohole is expected to be tuned effectively since the "air gaps" exhibit strong dielectric dispersion. FIGS. 5a and 5b display the fitted real and imaginary dielectric constant consider the films are isotropic absorbing layers. The experimental and fitted amplitude component ($\Psi$), phase difference ($\Delta$) and retrieved polarized reflectance spectra can be found in FIGS. 5e-5l (where in FIGS. 5e-5f are angular resolved $\Psi$ and $\Delta$ as a function of wavelength for Au—TiN film are shown, in FIGS. 5g-5h angular resolved $\Psi$ and $\Delta$ as a function of wavelength for TiN nanohole film are shown, in FIGS. 5i-5j p- and s-polarized reflectance spectra fitted from the model are shown, and in FIGS. 5k-5l p- and s-polarized reflectance spectra retrieved from the model are shown). The fully etched nanohole film is compared with reference samples including the half-way etched film, as-deposited Au—TiN template and the pure TiN film. Results indicate a gradual reduction of plasmonic property upon removal of Au phase, where $E_1$ (shown in FIG. 5a) becomes less negative approaching epsilon zero and $\pounds_2$ (as shown in FIG. 5b) decrease as a function of wavelength, indicating smaller losses. The inset of FIG. 5a shows a systematic tuning of the plasmon frequency, which indicates a change of charge carrier density. Next, the uniaxial model was applied where the real part dielectric tensor is separated into ordinary ($\varepsilon_{xx}$, $\varepsilon_{yy}$) and extra-ordinary ($\varepsilon_{zz}$) terms. Compare the TiN nanohole with pure TiN film (as shown in FIGS. 5c and 5d), the dispersion between in-plane and out-of-plane is much stronger in the nanohole film. Specifically, the extraordinary term is highly metallic while ordinary term is tuned upwards approaching zero permittivity, with the epsilon-near-zero (ENZ) transition at 730 nm. This phenomenon indicates a strong anisotropy of the nanohole film with intensive dielectric modulation in-plane. Interestingly, a hyperbolic transition ($\varepsilon_{xx}=\varepsilon_{yy}>0$, $\varepsilon_{zz}<0$) is observed in the optical range from 480 nm to 730 nm as marked by the shaded regime in FIG. 5c. Such hyperbolic behavior is correlated to the nanoscale hybrid as vertical geometry and strong variation of dielectric property between two phases. By tailoring the structure (e.g. density, aspect ratio), the hyperbolic transition is expected to be tuned, which is valuable for more explorations in future studies.

Figure 6A:
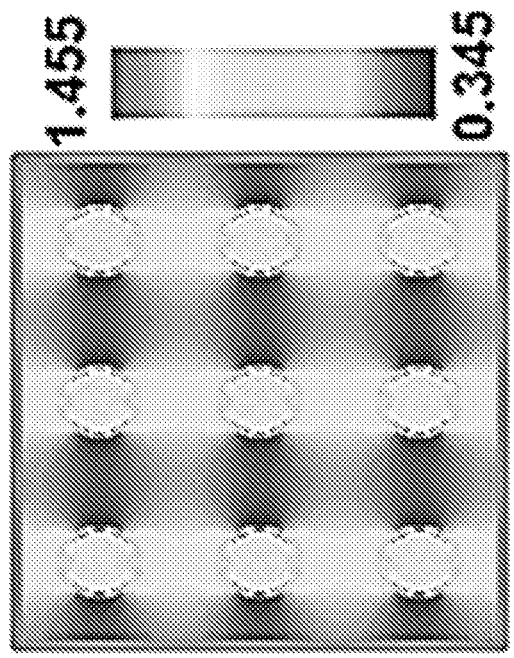
FIG. 6a is a schematic of a finite-difference time-domain (FDTD) simulation of nanohole film based on a 3*3 nanohole unit cell.
Figure 6A:
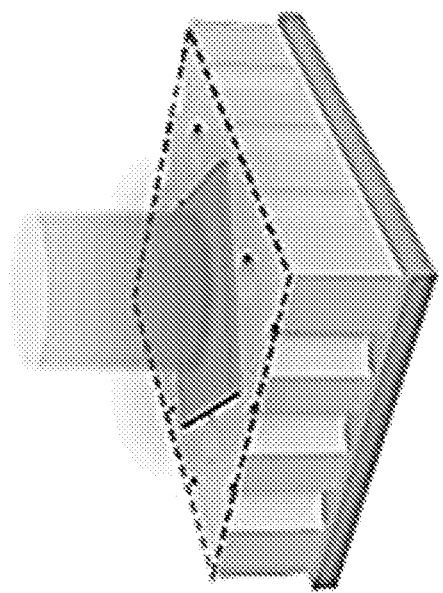
Figure 6B:
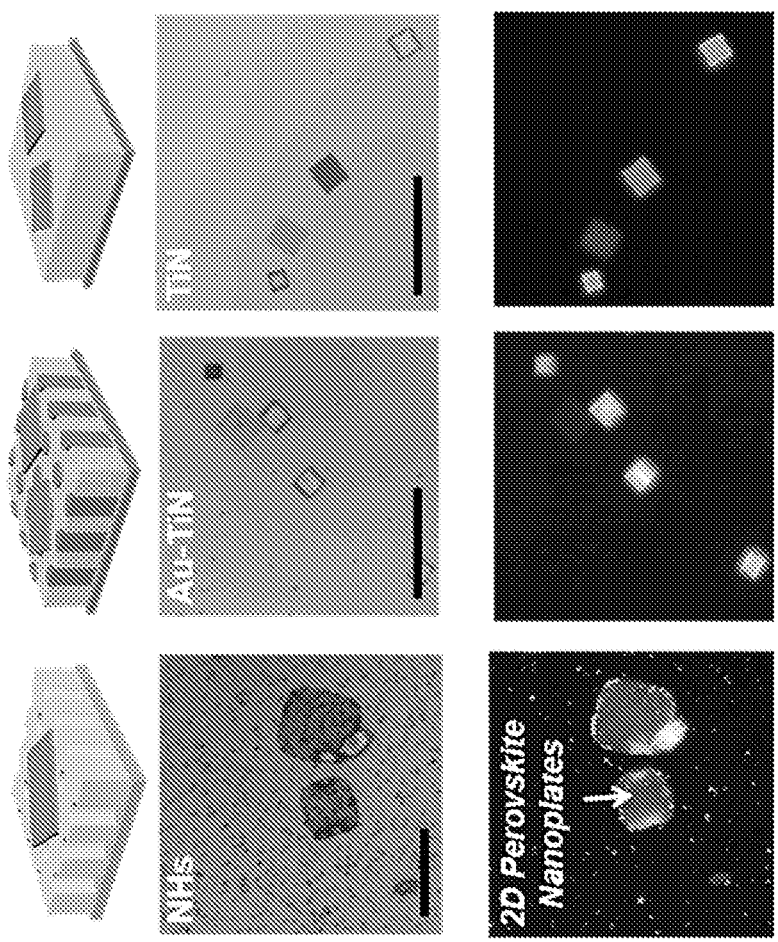
FIG. 6b provides photoluminescence (PL) properties of nanohole film coupled with a 2D perovskite nanoplate, showing microstructure and corresponding PL images of perovskite grown on top of TiN nanohole, Au—TiN, and pure TiN films.
Figure 6C:
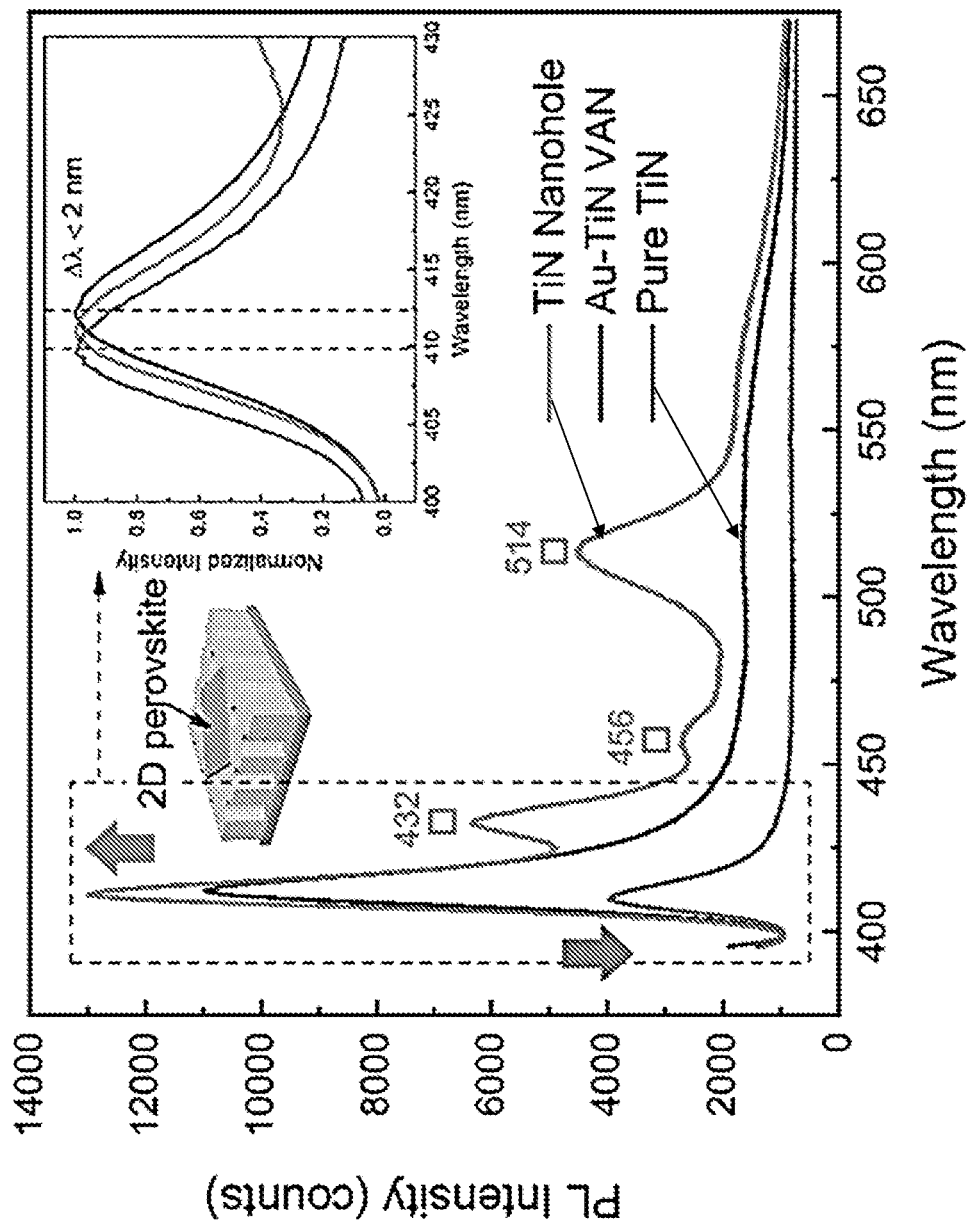
FIG. 6c is a graph of PL intensity vs. wavelength, where PL spectra is located at sample points with similar nanoplate thicknesses (inset shows the normalized PL intensity localized at about 410 nm).

As discussed, the strong SP mode excited inside plasmonic TiN nanohole film can be applied for sensing based optical devices. In the first demonstration, interfacial coupling between the metasurface with two-dimensional (2D) perovskite and its modulation on the photoluminescence (PL) was explored. Low-dimensional hybrid perovskites that generate new dynamics of plasmonic coupling and photonic cavities, have been demonstrated with such properties as efficient PL response while possessing moderate stability. As shown in FIG. 6a, a coherent laser is shining on the modified nanohole surface with strong SP near field. Here, the $(C_6H_5CH_2CH_2NH_3)_2PbBr_4$ nanocrystals were grown on top of the TiN nanohole film as well as on the Au—TiN and pure TiN films as reference. Detailed synthesis procedure is described in the Methods section. The resulted optical images and PL spectra are coupled in FIG. 6b. Under the same synthesis process, the nanoplate morphologies (as shown in FIG. 6b) on TiN and Au—TiN are comparable, while on the nanohole film the nanoplate dimension appears to be much larger. It is possible that these periodic "nanocavities" or "defects" affect the crystallization process and accelerate the agglomeration of the perovskite nanoplates during synthesis. In terms of PL spectra (provided in FIG. 6c), hybrid Au—TiN partially quenches the PL signal and the PL emission exhibits a slight blue shift (from 412.5 nm to 410 nm) compared to pure TiN. Note that the PL intensity was collected from three points with comparable perovskite layer thicknesses. Such PL quenching effect was reported in our previous study. However, an enhanced PL signal in the nanohole film is observed which is highly correlated to a strong local field enhancement. More importantly, three additional peaks at 432 nm, 456 nm and 514 nm are observed. Such phenomenon is likely to be correlated with the "defective" surface topology of the nanoscale cavities that contributes to additional recombination states. Additional measurements (data not shown) suggest a tunable response of such defect peaks that could be potentially related to factors such as dimension and thickness of the 2D perovskite nanoplates which affect the coupling with the nanohole surface. The underlying mechanism that causes the multiple peaks is more sophisticated and is valuable for further investigation.

Figures 7A, 7B:
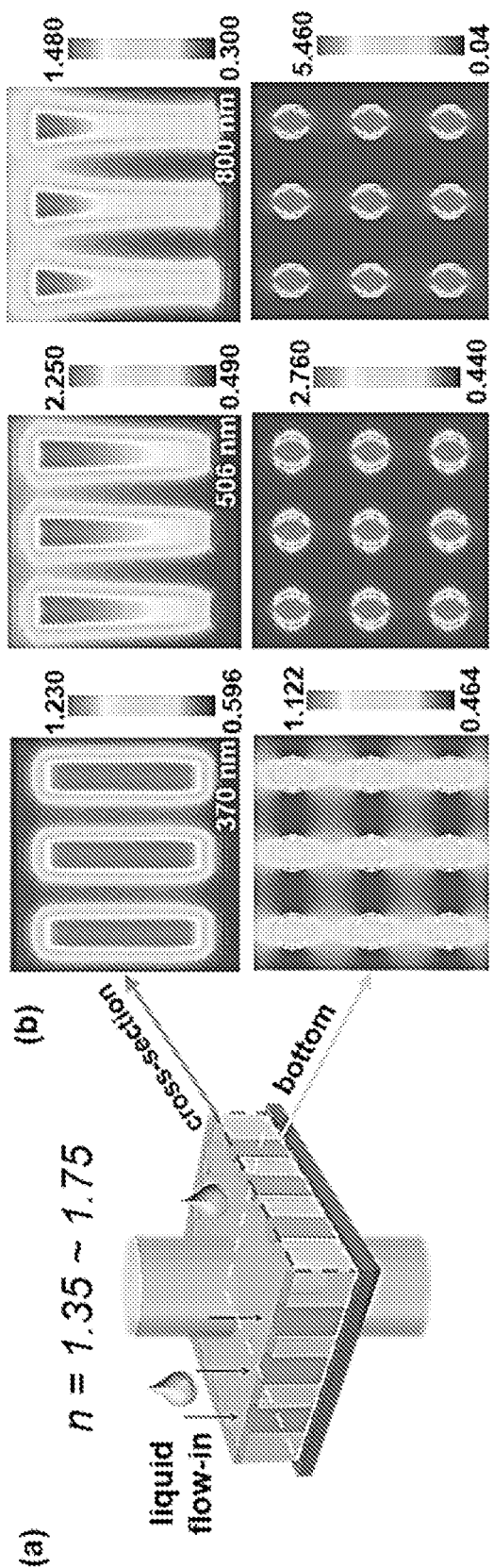
FIG. 7a is a schematic depicting the fundamental scheme where an optical beam is passing through the nanohole film trapped with an indexing liquids.
FIG. 7b provides electric field maps from cross-sections and bottom surface at three selected wavelengths: 370 nm, 506 nm, and 800 nm.
Figures 7C, 7D:
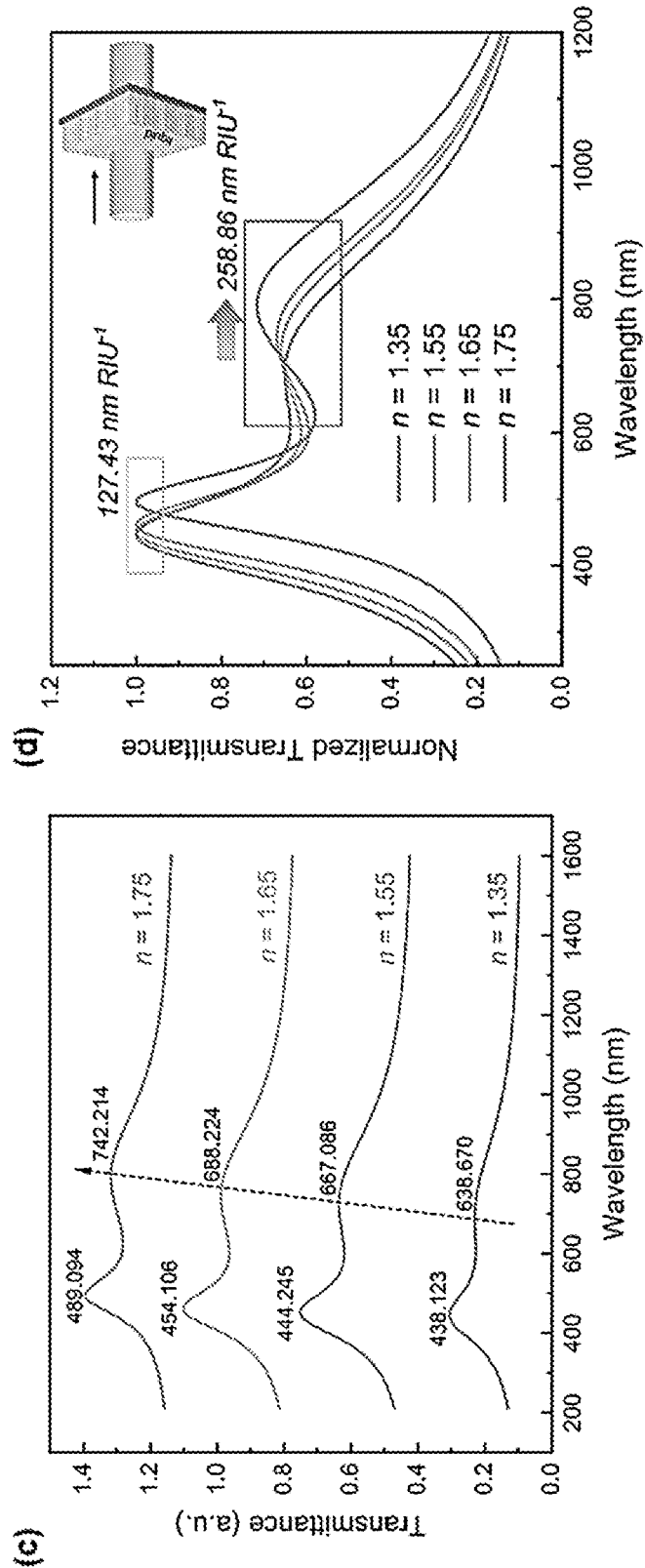
FIGS. 7c and 7d are graphs of transmittance and normalized transmittance vs. wavelength representing measured specular transmittance and the normalized spectra with testing immersion liquids (n=1.35, 1.55, 1.65, 1.75).
Figure 7E:
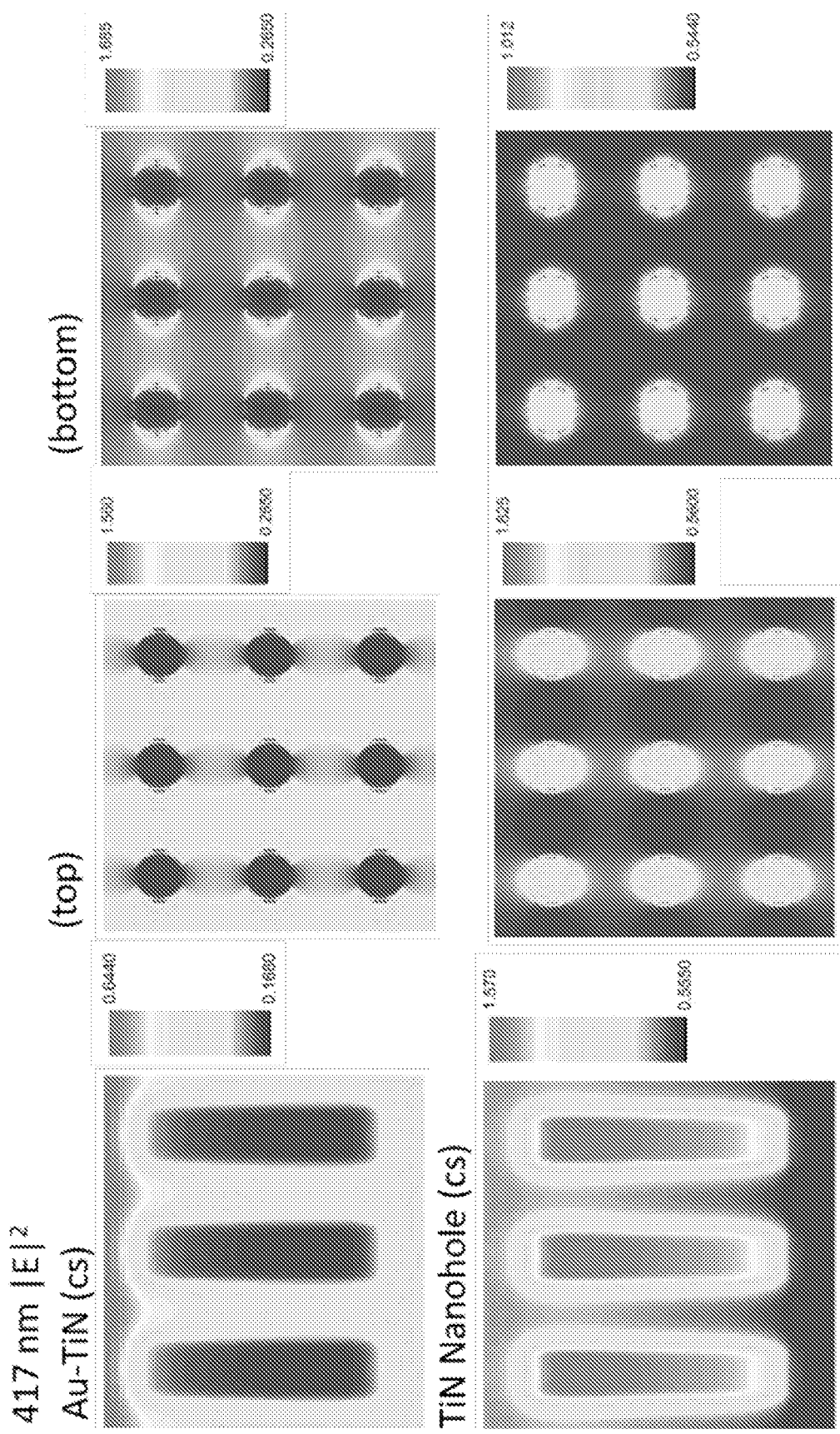
FIG. 7e provides field intensity maps where FDTD electric field maps of Au—TiN and TiN nanohole films at 417 nm is shown: maps at cross-section and top bottom planes of the films are presented from three-dimensional perspective.
Figure 7G:
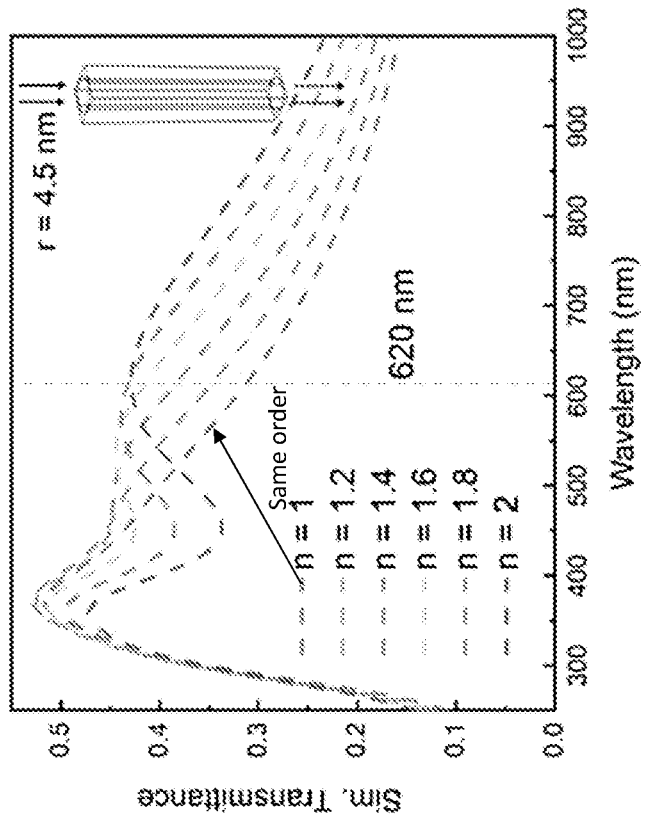
FIGS. 7f and 7g are graphs showing simulated spectra of nanohole with diameter of 6 nm and 9 nm, with changes of n from 1 to 2.
Figure 7F:
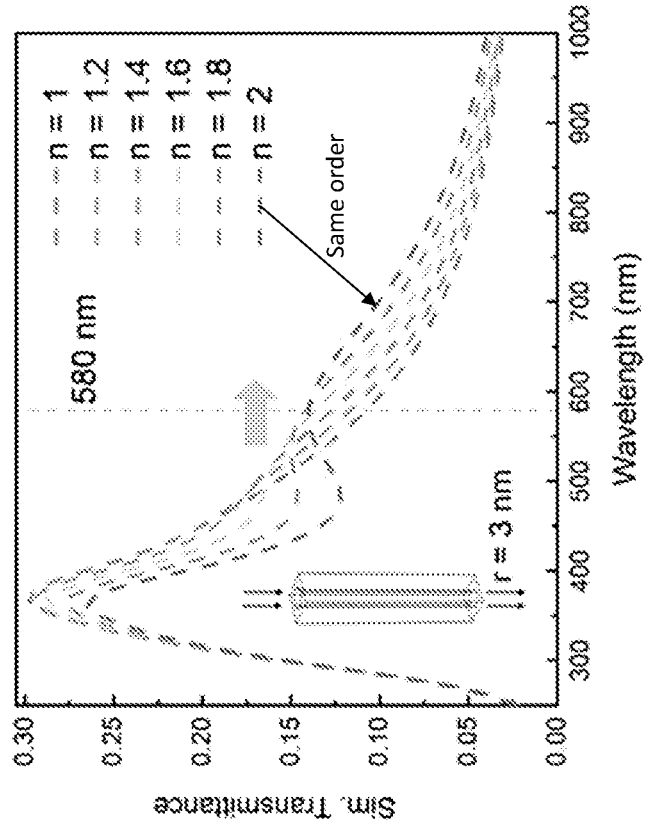

On the other hand, biomedical or chemical sensing could be an intuitive application taking advantage of the strong SP mode at nanohole edges. Our ultra-fine (6 nm) nanoholes can be considered as a unique "nanocapillary" tester with high sensitivity to the testing liquids that being infiltrated or covered on top. FIG. 7a describes the fundamental scheme where an optical beam is passing through the nanohole film trapped with the indexing liquids. It is noted that the illustration is an ideal case of full infiltration as the liquid could be partially immersed into the nanoholes. Electric field maps from cross-sections and bottom surface at three selected wavelengths: 370 nm, 506 nm, and 800 nm are shown in FIG. 7b. It can be seen that the field localization is strongest and sharpest close to nanohole edges which enable the propagating SPs through the holes. More details of field intensity maps can be found in FIG. 7e (where FDTD electric field maps of Au—TiN and TiN nanohole films at 417 nm is shown: maps at cross-section (left pane), top, and bottom planes of the films are presented from three-dimensional perspective, the Au—TiN template is showing strong surface plasmon resonance (SPR) at film surface (near field interactions) and edge of nanopillars, for TiN nanohole film, it exhibits strong field enhancement at hole edges and the strong resonance maintained through the holes). The experimental measurement was conducted by dropping the high-index immersion oil on sample surface and then placed the sample vertically facing the incoming beam. FIGS. 7c and 7d display the transmittance spectra before and after normalization. The major resonance peak close to 450 nm is attributed to the plasmonic TiN, while the shoulder peak on the right is attributed to the TiN-oil resonance. In order to separate the two resonances, Gaussian function is applied for peak deconvolution. From the results, a red shift from 638.67 nm to 742.21 nm with increase of index from n=1.35 to n=1.75 is observed for the shoulder peak. The simulated transmittance spectra with the change of index are plotted in FIGS. 7f and 7g for 6 nm diameter hole array and 9 nm hole array, respectively. With the increase of index, the peak experiences a red shift and the resonance becomes more pronounced for larger hole diameter, which matches with experimental results. Such red shift with increase of index number has been observed in other studies, which is associated with a change of the SP mode when the refractive index is changed at nanohole interface. But its mechanism is not fully explained and is beyond the scope of this paper.

Further, the sensitivity and figure of merit values of our nanohole film were calculated for the two peaks located close to 450 nm and 650 nm. The resulted specular shift per refractive index unit (RIU) values for two peaks are 127.43 and 258.86, and the corresponding figure of merit (FOM) values are 1.08 and 0.40, respectively. It is noted that the sensitivity values in the presented work is moderate as compared to some reported studies. This could be related to the infiltration depth of the immersion liquids and increased electron scattering due to the ultra-fine hole diameter. Consider future improvements, the periodicity of the nanohole arrays can be further improved. For example, high in-plane ordering has been achieved in the Au—TaN hybrid system with a clear hexagonal close packed periodicity of the Au nanopillars. The reason we selected Au—TiN for this study is that TiN has much better plasmonic property, strong chemical and mechanical integrity than TaN. Overall, the TiN-based nanohole film is demonstrated as a large scale (cm to inches) platform for low-cost durable plasmonic sensing.

Taking advantage of the strong SP mode of TiN nanohole films, the above demonstrations provide pathways toward multiple sensing applications. First, coupling nanohole arrays with low-dimensional functional materials (e.g. hybrid perovskites, graphene, black phosphorus, antimonene) is expected to modulate the plasmonic resonance, photoluminescence and absorption for light harvesting or high-resolution imaging at visible frequency. In addition, such tiny nanoholes at deep-subwavelength scale will be advantageous to trace amounts detection and thus can be applied to biomedical sensors for molecule tracking or blood test. One additional advantage is that the nanohole template is robust and reusable, as TiN is a refractory plasmonic material that can endure thermal and laser treatment. It can be easily integrated with optical spectroscopies for various molecular sensing applications. Further improvement on periodicity and geometrical tuning of the nanohole arrays are worth exploring toward more effective sensing applications.

Fabrication

Fabrication. 1) Au—TiN thin film growth: the template films (30 nm to 50 nm) were grown on single crystalline MgO (001) substrates using pulsed laser deposition (PLD) system (Lambda Physik Compex Pro 205, KrF excimer laser, $\lambda$=248 nm). The laser beam was focused onto the target with an incident angle of 45°, frequency of 2 Hz, and energy density of around 3.0 J/cm$^2$. The chamber was pumped to high vacuum ($2.0 \times 10^{-6}$ mbar) and the deposition temperature was maintained at 700° C. After the deposition, the chamber was cooled to room temperature at 15° C./min. 2) Nanohole fabrication: wet etching of Au was carried on as-deposited Au—TiN thin films, by adding droplets of fresh AQUA REGIA ($HNO_3$:HCl) acid solution on the film surface for 30 s. After etching, the samples were rinsed with DI water for 1 min. 3) Growth of $(C_6H_5CH_2CH_2NH_3)_2PbBr_4$ nanoplates: The whole process, including the solution preparation and nanoplates growth, was performed inside a nitrogen-filled glove box. The as-purchased $C_6H_5CH_2CH_2NH_3Br$ (4.0 mg, 20 µmol, Greatcell solar Ltd.) and $PbBr_2$ (3.67 mg, 10 µmol, Greatcell solar Ltd.)) were dissolved in 1 mL of anhydrous dimethylformide (DMF) and 1 mL of anhydrous chlorobenzene (CB) inside a 4 mL glass vial. The solution was then diluted 120 times by a mixture solvent acetonitrile/CB (1:2.5 volume ratio). Si/SiO$_2$ substrates was used as the growth substrate for the nanoplates. The substrates were dried in the oven and transferred into the glove box and preheated on a hot plate at 70° C. 5-10 µL of the diluted solution was dropped onto the substrates and kept for 10 min. $(C_6H_5CH_2CH_2NH_3)_2PbBr_4$ nanoplates grew spontaneously as the solvent evaporated.

Microstructure characterization. The structure of the films was characterized by X-ray diffraction (XRD) and high angle annular dark field (HAADF) scanning transmission electron microscopy (STEM). XRD $\theta$-$2\theta$ scans were performed using a Panalytical X'Pert X-ray diffractometer with Cu $K_\alpha$ radiation. HAADF STEM and energy-dispersive X-ray spectroscopy (EDS) chemical mapping were acquired by the FEI Talos F200X TEM. HRSTEM was carried on an aberration-corrected microscope (AC-STEM). The specimens were prepared using a standard cross-section sample preparation procedure, including manual grinding, polishing, dimpling and an ion milling step (PIPS 691 precision ion polishing system, 4.0 keV).

Optical properties. Normal incident depolarized transmittance (T %) spectra were measured using an optical spectrophotometer (Lambda 1050 UV/Vis Spectrophotometer) with total absolute measurement system (TAMS). Refractive index immersion oils (liquids) were purchased from Cargille Laboratories. Ellipsometry experiments were carried on a RC2 spectroscopic ellipsometer (J. A. Woollam Company). Three angles 30°, 45° and 60° and a spectrum range from 210-2500 nm were covered for the measurements. The bright-field optical images were collected by a custom Olympus BX53 microscope. A home-built photoluminescence microscopy was used to conduct the measurement. The sub-picosecond excitation beam with 400 nm wavelength came from OPA (TOPAS-Twins, Light Conversion Ltd. 400 kHz repetition rate), it is focused onto the sample by a 40× objective (Nikon, NA=0.6). The PL emission was collected by the same objective, dispersed by a 300-mm spectrometer (Andor Tech.) and then detected by a TE cooled CCD (Newton, Andor Tech.). The filter cube contains a bandpass filter (330-385 nm) for excitation, a dichroic mirror (cut-off wavelength: 400 nm) for light splitting and a long pass filter (420 nm) for emission. The PL images were then collected by the Olympus BX53 microscope and the spectra were collected by SpectraPro HRS-300 spectrometer.

Numerical Simulations and data fitting. 1) COMSOL Multiphysics Wave Optics Module: applied for extracting optical spectra and electric field maps. Optical constants (n and k) for pure TiN were taken from fitted ellipsometry data of an 80 nm TiN film on MgO substrate. The optical model was built by a four-pillar unit cell with periodic boundaries, pillar dimensions and packing distance are matched with real structure. 2) Finite-Difference Time-Domain method (Lumerical Solutions): nanohole arrays with a pitch of 16 nm were created with the height and diameter of the nanoholes set to be 30 nm and 6 nm, respectively. Permittivity of the TiN films were obtained from ellipsometry measurements. Mesh size was set to be much smaller than the nanostructure to ensure precision of the simulation. 3) Ellipsometry fitting: optical parameters (i.e. real and imaginary part of permittivity) are retrieved using the software CompleteEASE supported by J. A. Woollam Company. Films are considered as a B-Spline absorbing layer. The mean square error (MSE) of data fitting is below 3 that indicates a desired match.

The present disclosure demonstrates a unique and simple approach to fabricate large-scale plasmonic nanohole arrays by selective wet-etching of metals from a metal (Au)—nitride (TiN) VAN template. The resulted nanoholes own an average dimension of 6 nm and packing distance of 8 nm with high epitaxial quality, free of strain or chemical induced morphological deformation. Removal of Au phase enables a transition from LSPR to propagating SPs with strong electric field enhancement localized at nanohole surfaces. Optical functionalities including enhanced transmission and highly anisotropic dielectric dispersion with a hyperbolic transition in the range of 638.67 nm to 742.21 nm have been observed. Supported by numerical simulation, the sub-10 nm TiN nanohole implemented metamaterial with strong SP modes at top and cross-sectional nanohole surfaces is highly sensitive to surface coupling with 2D perovskite or changes of local refractive indices. Based on two initial demonstrations, this nanohole framework presents enormous potential as robust and reusable SP-enhanced optical sensing platform for multiple applications.

In the present disclosure, the metal-nitride template for etching can be extended to more metals aside from Au, for example, Ag, Co, Ni, Cu, Fe, Al, etc. Note that the etchant needs to be carefully changed for different metals. The packing distance (hole-to-hole) can be tailored as desired by controlling density of the metal phase when preparing the template. The nanohole dimension can be tuned from about 2 nm to about 20 nm, by controlling growth temperature and laser frequency. According to another embodiment, the diameter of the nanoholes can be between about 2 nm and about 10 nm. According to yet another embodiment, the diameter of the nanoholes can be between about 2 nm and about 5 nm. The film thickness (i.e., the cross-sectional thickness of the VAN structure) is between about 5 nm to about 1 micron by controlling growth time. According to another embodiment, the film thickness can be between about 5 nm and about 100 nm. According to yet another embodiment, the film thickness can be between about 5 nm and about 10 nm. The pitch (i.e., the distance from center to center) of the nanoholes is between about 5 nm to about 30 nm. The metal nitride material is selected from the group consisting of TiN, TaN, ZrN, HfN, and combinations thereof. The method can also be applied for nanohole production by selective etching of metal-ceramic (e.g. oxide, carbide, nitride) vertically aligned nanocomposites. The substrate material is selected from the group consisting of Si, $SiO_2$, MgO, $SrTiO_3$, $LaAlO_3$, glass, and combinations thereof. The metal inside the metal nitride according to one embodiment described above is selected from the group consisting of Au, Ag, Co, Ni, Cu, Fe, Al, and alloys thereof. According to the embodiment where the metal inside the nanoholes are etched based on time of etching and the etchant, the percentage of metal inside the nanoholes can vary between about 0% to about 100% of the height of the nanoholes. According to another embodiment, the percentage of metal inside the nanoholes can vary between about 0% to about 50% of the height of the nanoholes. According to yet another embodiment, the percentage of metal inside the nanoholes can vary between about 0% to about 10% of the height of the nanoholes.

Several etchants have been investigated for different metals in the VAN structures. These different metals include pure Ag, pure Au, and pure Co. Table 1 below provides a list of etchants used with these metals and the duration of the etching process.

TABLE 1

VAN metals and etchants

| Material | Etchant | Conditions |
| --- | --- | --- |
| Pure Ag | 100 mL distilled water, 5-10 g potassium cyanide | Several mins |
| Pure Au | 66 mL hydrochloric acid (32%), 34 mL nitric acid (65%) | Seconds to mins Use only fresh |
| Pure Co | 100 mL methanol (99.8%), 1-50 mL nitric acid (65%) | Seconds to mins Neutralize after use |

Those having ordinary skill in the art will recognize that numerous modifications can be made to the specific implementations described above. The implementations should not be limited to the particular limitations described. Other implementations may be possible.

The invention claimed is:

1. A nanohole template, comprising:
a solid substrate;
a vertically aligned nanocomposite (VAN) structure disposed over the substrate, the VAN structure is made from a transition metal-nitrides having circular periodic nanoholes of about 2 nm to about 20 nm in diameter, wherein the nanoholes are filled with a fluid, wherein the solid substrate and the VAN structure are made of dissimilar materials,
wherein the solid substrate material is selected from the group consisting of Si, $SiO_2$, MgO, $SrTiO_3$, $LaALO_3$, glass, and combinations thereof, and
wherein the VAN structure material is selected from the group consisting of TiN, TaN, ZrN, HfN, and combinations thereof.

2. The nanohole template of claim 1, the VAN structure includes a pitch (center-to-center distance) of about 5 nm to about 30 nm.

3. The nanohole template of claim 2, the VAN structure includes a thickness representing height of the nanoholes of about 5 nm to about 1000 nm.

4. The nanohole template of claim 1, the fluid includes air.

5. The nanohole template of claim 1, the fluid includes a liquid.

6. The nanohole template of claim 5, the liquid includes an immersion oil.

* * * * *